US012568661B2

(12) United States Patent
Xie et al.

(10) Patent No.: US 12,568,661 B2
(45) Date of Patent: Mar. 3, 2026

(54) SELF-ALIGNED BACKSIDE TRENCH EPITAXY FOR LOW CONTACT RESISTIVITY

(71) Applicant: INTERNATIONAL BUSINESS MACHINES CORPORATION, Armonk, NY (US)

(72) Inventors: Ruilong Xie, Niskayuna, NY (US); Dechao Guo, Niskayuna, NY (US); Kisik Choi, Watervliet, NY (US); Oleg Gluschenkov, Tannersville, NY (US); Shogo Mochizuki, Mechanicville, NY (US)

(73) Assignee: International Business Machines Corporation, Armonk, NY (US)

( * ) Notice: Subject to any disclaimer, the term of this patent is extended or adjusted under 35 U.S.C. 154(b) by 825 days.

(21) Appl. No.: 17/656,890

(22) Filed: Mar. 29, 2022

(65) Prior Publication Data
US 2023/0317782 A1      Oct. 5, 2023

(51) Int. Cl.
H10D 62/10           (2025.01)
B82Y 10/00           (2011.01)
(Continued)

(52) U.S. Cl.
CPC ......... H10D 62/118 (2025.01); H01L 23/481 (2013.01); H10D 30/031 (2025.01);
(Continued)

(58) Field of Classification Search
CPC ............. H10D 30/6713; H10D 84/013; H10D 30/0198; H10D 30/797; H10D 64/251;
(Continued)

(56) References Cited

U.S. PATENT DOCUMENTS 6,495,454 B2    12/2002  Livengood
8,264,082 B2     9/2012  Edouard
(Continued)

FOREIGN PATENT DOCUMENTS

WO        2000065646 A1    11/2000

OTHER PUBLICATIONS

Gupta et al., "Buried Power Rail Scaling and Metal Assessment for the 3 nm Node and Beyond", 2020 IEEE International Electron Devices Meeting (IEDM), @2020 IEEE, 4 pages.
(Continued)

*Primary Examiner* — Sonya McCall-Shepard
(74) *Attorney, Agent, or Firm* — L. Jeffrey Kelly

(57) ABSTRACT

A first and a second nanosheet stack, a first source drain to the first nanosheet stack, a carrier wafer bonded to an upper surface, a bottom source drain contact located on a bottom surface of the first source drain, an epitaxial region between the bottom source drain contact and the first source drain, a second source drain adjacent to the second nanosheet stack and a top source drain contact located on an upper surface of the second source drain, the bottom source drain contact and the top source drain contact on opposite sides. Forming a first and a second nanosheet stack, forming an upper top source drain contact to first source drain adjacent to the first nanosheet stack, bonding a carrier wafer to an upper surface and forming a bottom source drain contact to a lower horizontal surface of a second source drain adjacent to the second nanosheet stack.

20 Claims, 37 Drawing Sheets

Section Y-Y

(51) Int. Cl.

| | |
|---|---|
| *H01L 21/285* | (2006.01) |
| *H01L 21/768* | (2006.01) |
| *H01L 23/48* | (2006.01) |
| *H01L 23/528* | (2006.01) |
| *H10D 30/01* | (2025.01) |
| *H10D 30/43* | (2025.01) |
| *H10D 30/67* | (2025.01) |
| *H10D 30/69* | (2025.01) |
| *H10D 62/13* | (2025.01) |
| *H10D 64/01* | (2025.01) |
| *H10D 64/23* | (2025.01) |
| *H10D 84/01* | (2025.01) |
| *H10D 84/03* | (2025.01) |
| *H10D 84/83* | (2025.01) |

(52) U.S. Cl.
CPC ..... *H10D 30/6713* (2025.01); *H10D 30/6735* (2025.01); *H10D 84/0128* (2025.01); *H10D 84/013* (2025.01); *H10D 84/038* (2025.01)

(58) Field of Classification Search
CPC .......... H10D 84/0149; H10D 30/6735; H10D 84/0128; H10D 84/038; H10D 30/014; H10D 30/43; H10D 30/6757; H10D 62/151; H10D 84/83; H01L 23/481; H01L 23/5286; H01L 21/28525; H01L 21/76897
See application file for complete search history.

(56) References Cited

U.S. PATENT DOCUMENTS

| | | | |
|---|---|---|---|
| 9,570,395 | B1 | 2/2017 | Sengupta |
| 9,761,696 | B2 | 9/2017 | Li |
| 10,586,765 | B2 | 3/2020 | Smith |
| 10,636,739 | B2 | 4/2020 | Beyne |
| 10,700,207 | B2 | 6/2020 | Chen |
| 2020/0105671 | A1 | 4/2020 | Lai |
| 2021/0134721 | A1 | 5/2021 | Chiang |
| 2021/0202385 | A1 | 7/2021 | Huang |
| 2021/0305381 | A1* | 9/2021 | Chiang .............. H10D 84/0149 |
| 2021/0343639 | A1* | 11/2021 | Wang ................ H01L 21/76897 |

OTHER PUBLICATIONS

Mathur et al., "Buried Bitline for sub-5nm SRAM Design", 2020 IEEE International Electron Devices Meeting (IEDM), 7 Pages.
Prasad et al., "Buried Power Rails and Back-side Power Grids: Arm® CPU Power Delivery Network Design Beyond 5nm", 2019 IEEE International Electron Devices Meeting (IEDM), ©2019 IEEE, pp. 19.1.1-19.1.4.
Gupta et al., "Buried Power Rail Integration with Si FinFETs for CMOS Scaling beyond the 5 nm Node", 2020 Symposium on VLSI Technology Digest of Technical Papers—THL.6, Jun. 2020, 02 pages.
James Dick "Pat Gelsinger Takes us on a Trip Down Memory Lane—and a Look Ahead", Jul. 11, 2025, 12 pages, https://www.techinsights.com/blog/pat-gelsinger-takes-us-trip-down-memory-lane-and-look-ahead?utm_source=direct&utm_medium=website.

* cited by examiner

100

Section X-X

Section Y-Y

100

Y

104

| 112 | | 112 | | 112 | | 112 |
| 104 | | 104 | | 104 | | 104 |
| | 118 | | 118 | | 118 | |
| 112 | | 112 | | 112 | | 112 |
| 104 | | 104 | | 104 | | 104 |
| 112 | | 112 | | 112 | | 112 |

X

X

104

Y

Section X-X

Section Y-Y

Section X-X

Section Y-Y

Section X-X

Section Y-Y

100

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

SELF-ALIGNED BACKSIDE TRENCH EPITAXY FOR LOW CONTACT RESISTIVITY

BACKGROUND

The present invention relates, generally, to the field of semiconductor manufacturing, and more particularly to a backside contact.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. As demands to reduce the dimensions of transistor devices continue, nanosheet FETs help achieve a reduced FET device footprint while maintaining FET device performance. A nanosheet device contains one or more layers of semiconductor channel material portions having a vertical thickness that is substantially less than its width. A nanosheet FET includes a plurality of stacked nanosheets extending between a pair of source/drain epitaxial regions. The device may be a gate all around device or transistor in which a gate surrounds a portion of the nanosheet channel.

SUMMARY

According to an embodiment, a semiconductor device is provided. The semiconductor including a substrate including a first nanosheet stack and a second nanosheet stack, a first source drain adjacent to the first nanosheet stack, a carrier wafer bonded to an upper surface of the semiconductor device above the first nanosheet stack and the second nanosheet stack, a bottom source drain contact located on a bottom surface of the first source drain, a second source drain adjacent to the second nanosheet stack, and a top source drain located on an upper surface of the second source drain, where the bottom source drain contact and the top source drain contact are on opposite sides of the semiconductor device.

According to an embodiment, a semiconductor device is provided. The semiconductor including a substrate including a first nanosheet stack and a second nanosheet stack, a first source drain adjacent to the first nanosheet stack, a carrier wafer bonded to an upper surface of the semiconductor device above the first nanosheet stack and the second nanosheet stack, a bottom source drain contact located on a bottom surface of the first source drain, an epitaxial region between the bottom source drain contact and the first source drain, a second source drain adjacent to the second nanosheet stack and a top source drain contact located on an upper surface of the second source drain, where the bottom source drain contact and the top source drain contact are on opposite sides of the semiconductor device.

According to an embodiment, a method is provided. The method including forming a first nanosheet stack and a second nanosheet stack on a substrate, forming a top source drain contact to an upper horizontal surface of a first source drain adjacent to the first nanosheet stack, bonding a carrier wafer to an upper surface of the substrate above the first nanosheet stack and the second nanosheet stack and forming a bottom source drain contact to a lower horizontal surface of a second source drain adjacent to the second nanosheet stack.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

Figure 1:
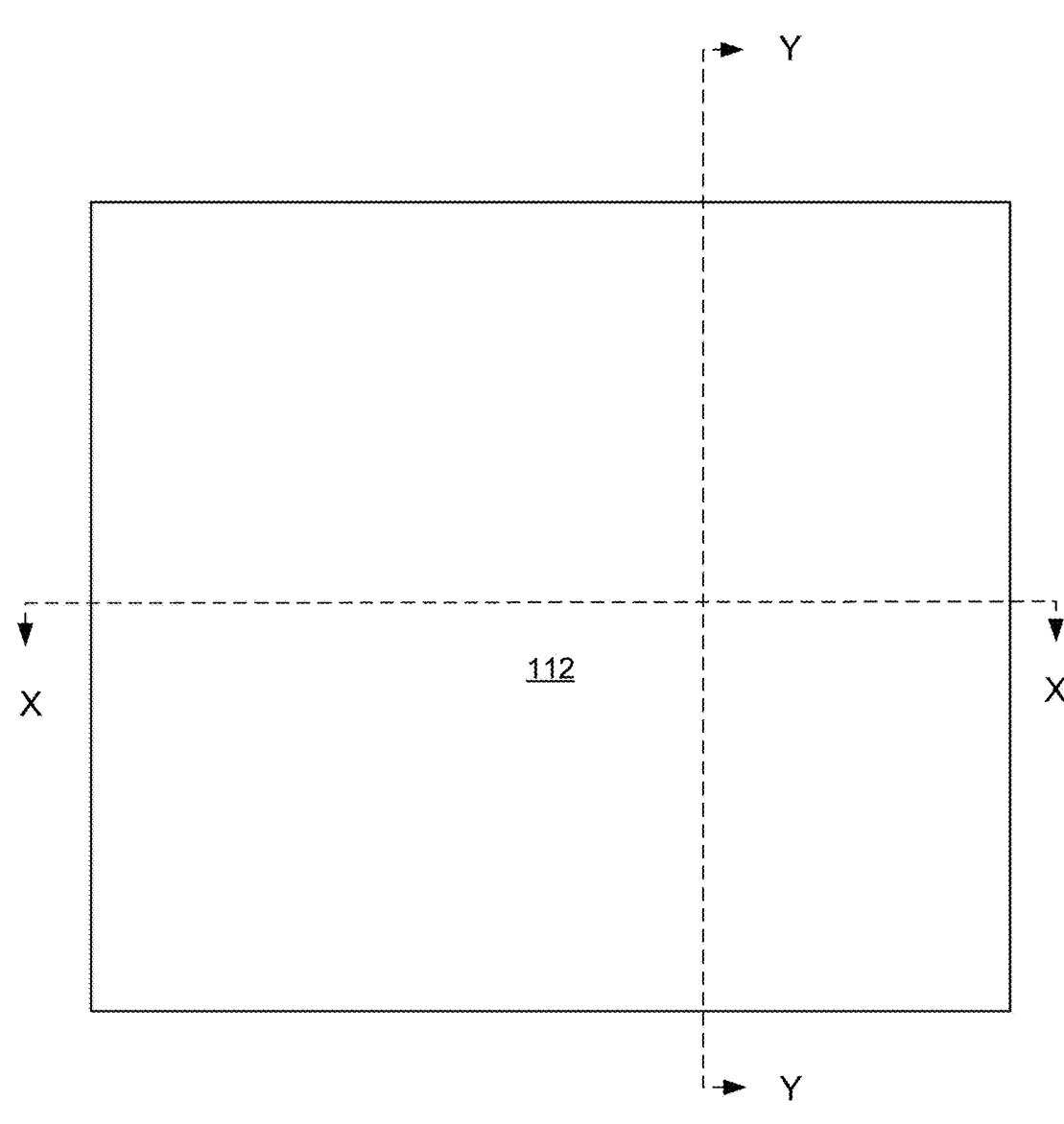
FIG. 1 illustrates a top view of a semiconductor structure at an intermediate stage of fabrication, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A nanosheet field effect transistor (hereinafter "FET") may be formed from alternating layers of silicon and silicon germanium, which are then formed into stacked nanosheets. A gate all around structure may be formed on all vertical sides and on a horizontal top surface of a section of the nanosheets. Source-drain structures may be formed at the opposite ends of the stacked nanosheet structures.

Forming the nanosheet FET may have the following steps. Layers of the stacked nanosheet are formed on a substrate, trenches are formed parallel to each other in the layers of the stacked nanosheet to form fins and sacrificial gates are then formed perpendicular to the trenches. Additional trenches are formed between sacrificial gates, perpendicular to the original trenches. Outer portions of sacrificial layers of the stacked nanosheets may be removed and inner spacers formed where the outer portions of the sacrificial layers of the stacked nanosheets where removed. Source drain regions are formed extending out from exposed channel layers of the nanosheet stacks. The sacrificial gates are removed, and remaining portions of the sacrificial layers are removed. Work function metal may be formed where the sacrificial gates and the remaining portions of the sacrificial layers were removed, surrounding the channel layers. Contacts may be formed to the work function metal and to the source drain. Further formation of back end of line (BEOL) layers of wiring and vias may be done.

An alternative method of forming contacts may include bonding a carrier substrate to an upper surface of the formed nanosheet FET with BEOL layers, above the BEOL layers, turning the structure upside down and then forming a backside contact through the substrate to the nanosheet FET. A key concern of the backside contact is higher contact resistivity due to avoidance of a high temperature anneal. A high temperature anneal cannot be performed to avoid damage of BEOL interconnects which are already formed on the front side of the substrate.

Methods are required to reduce the resistance of the contact between the metal and the semiconductor, to improve the contact resistance and resistivity for backside contacts. A contact resistivity is a physical property of an interface between two dissimilar conductive materials that quantifies an interfacial resistance to the electrical current crossing fixed-area interface. Metal-metal interfaces have a low contact resistivity of $10^{-12}$-$10^{-10}$ $\Omega \cdot cm^2$ and their resistance can be neglected with respect to that of semiconductor-metal interface that has a typical contact resistivity of the order of $10^{-9}$-$10^{-8}$ $\Omega \cdot cm^2$. State-of-the-art engineered interfaces between a metallic compound such as silicide or germanosilicide and a highly-doped and highly-activated, degenerate semiconductor such as silicon, silicon germanium, or germanium allow for contact resistivities of around $10^{-9}$ $\Omega \cdot cm^2$ for both n- and p-doped semiconductors and adjacent metallic compounds. A contact resistance of an interface factors in both the interfacial resistivity and the interface geometry (interface area, for instance). If an electrical current density remains constant across the interface, the contact resistance is the interfacial resistivity divided by the interface area. As a dimension of contact area decreases, the contact resistance increases. Traditionally, in order to enable transistor geometrical scaling without any loss of performance, the contact resistivity is reduced through materials engineering to offset a decrease in the contact area. Forming backside contact in the presence of formed BEOL layers and frontside transistors reverts back its contact resistivity to about $10^{-8}$ $\Omega \cdot cm^2$ due to the inability of conducting high-temperature dopant activation anneals, as alluded above. Such high contact resistivity may negate any geometrical scaling benefit of the backside contact.

A solution to reduce the higher contact resistivity of the backside contact is to form an opening under the channel where a subsequent source drain will be formed, form a self-aligned sacrificial backside contact in the opening and form a source drain epitaxy over the self-aligned sacrificial backside contact. Continuing the description of the solution, continue to form the nanosheet FET via a standard process which includes front end of line (FEOL), middle of line (MOL) and BEOL processes, mounting a carrier substrate to the structure and flipping the structure over. Then remove the sacrificial backside contact, form a low-thermal-budget trench epitaxy from the exposed source drain and form the backside metallic contact to the trench epitaxy. Additional layers of lines and vias may be formed above the backside contact and may connect to the backside contact.

There are several advantages to formation of a low-thermal-budget trench epitaxy to form the backside contact. The low-thermal-budget refers to the compatibility to temperature-sensitive structures that are present on the front side of the wafer. These temperature sensitive structures include BEOL interconnects and transistor gate stacks. In one example, the low-thermal-budget processes may refer to low-temperature processes conducted at temperatures below 450° C. for a duration of minutes. In another example, the low-thermal-budget processes may refer to short duration thermal processes from about 1 millisecond to about 10's of nanoseconds conducted at a high temperature ranging from 750° C. to 1300° C. The trench epitaxy refers to an epitaxial process of forming or re-forming a surface layer of S/D doped semiconductor through the backside contact trench. The trench epitaxy may include a combination of gas-phase epitaxial growth, solid-phase epitaxial re-growth, and liquid phase epitaxial re-growth. One purpose of trench epitaxy is to form a highly-activated, degenerate surface semiconductor layer adjacent to the backside metal contact at the low-thermal-budget. Another purpose of trench epitaxy is to form a surface semiconductor alloy with a low Schottky barrier to the adjacent backside metal contact at the low-thermal-budget. An amount of active dopant in the trench epitaxy surface layer can be specified by the concentration of free carries (electrons or holes) present in the layer at or above 7e20 $cm^{-3}$, and, more preferably, at or above 1e21 $cm^{-3}$. In one example, the trench epitaxy surface layer for p-type semiconductor contact consists of the semiconductor-dopant alloy containing Group IV, high-Z atoms (Ge and/or Sn) and Group III p-type dopants such as B, Al, Ga, where a mixture of low-Z (e.g. B and/or Al) and high-Z (e.g. Ga and/or In) dopant atoms are highly preferred. The trench epitaxy surface layer for p-type semiconductor contact may also contain silicon. The total chemical concentration of p-type dopant in the trench epitaxy surface layer preferably exceeds 5 atomic percent, at. %, or, equivalently, 2.5e21 $cm^{-3}$. In one example, the trench epitaxy surface layer for n-type semiconductor contact consists of the semiconductor-dopant alloy containing Group IV, low-Z atoms (e.g. Si and C) and Group V n-type dopants such as P, As, Sb, where a low-Z dopant atoms (e.g. P) is highly preferred. The total chemical concentration of n-type dopant in the trench epitaxy surface layer preferably exceeds 5 at. %, or, equivalently, 2.5e21 $cm^{-3}$. The trench epitaxy surface layer may be between 1 nm and 10 nm thick. The trench epitaxy surface layer helps to reduce the contact resistivity of the backside contact to $10^{-9}$ $\Omega \cdot cm^2$ or below for both n-type and p-type semiconductor-metal contact.

Having a self-aligned contact is an additional advantage because backside lithography alignment accuracy is not as good as frontside lithography due to wafer distortion or non-uniformity in thickness. The self-aligned contact is formed by forming the sacrificial backside contact placeholder under the source drain epitaxy such that the location of the backside contact is pre-defined, and no longer relies on the overlay performance of backside lithography process.

The present invention relates, generally, to the field of semiconductor manufacturing, and more particularly a backside contact.

Embodiments of the present invention disclose a structure and a method of forming a FET nanosheet with a self-aligned backside trench epitaxy for low contact resistivity are described in detail below by referring to the accompanying drawings in FIGS. 1-37, in accordance with an illustrative embodiment.

Figure 2:
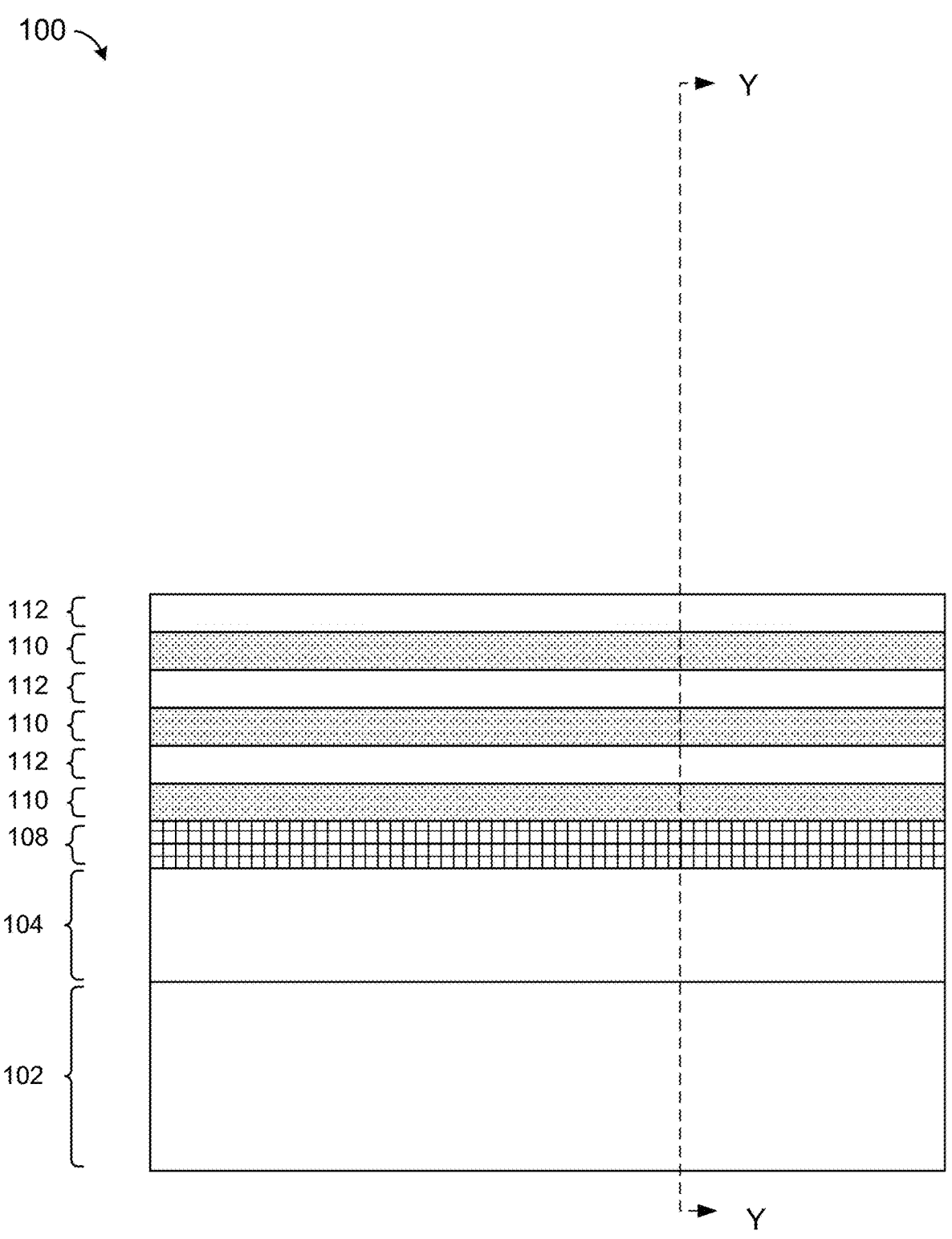
FIGS. 2 and 3 each illustrate a cross-sectional view of the semiconductor structure of FIG. 1 along section line X-X and Y-Y, respectively, according to an exemplary embodiment.
Figure 3:
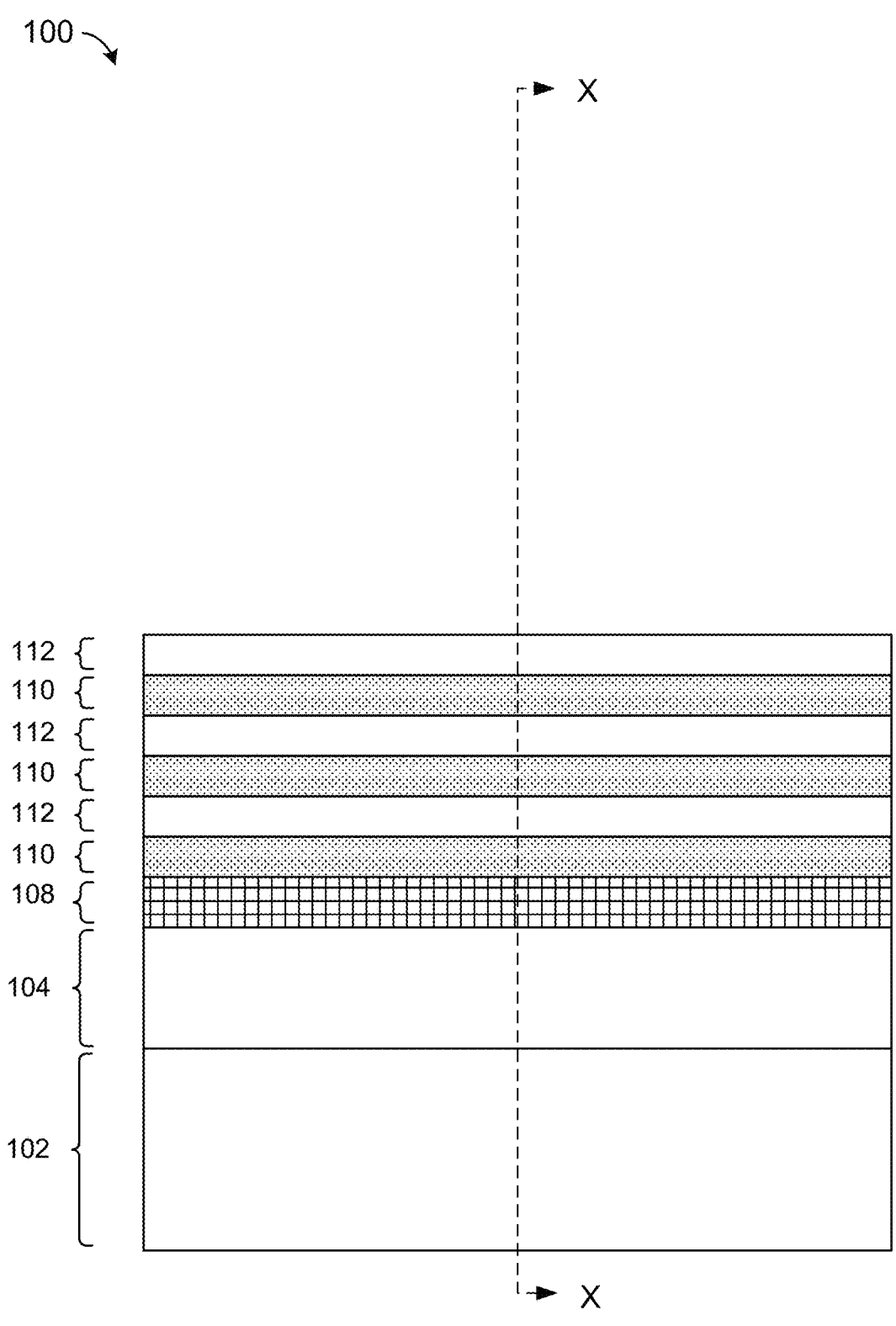

Referring now to FIGS. 1, 2 and 3, a semiconductor structure 100 (hereinafter "structure") at an intermediate stage of fabrication is shown according to an exemplary embodiment. FIG. 1 is a top view of the structure 100. FIG. 2 is a cross-sectional view of the structure 100 along section line X-X. FIG. 3 is a cross-sectional view of the structure 100 along section line Y-Y and is perpendicular to section line X-X. The structure 100 of FIG. 1 may be formed or provided.

The structure 100 may include alternating layers of sacrificial semiconductor material and semiconductor channel material stacked one on top of another on a substrate. It should be noted that, while a limited number of alternating layers are depicted, any number of alternating layers may be formed.

The substrate may be a silicon-on-insulator ("SOI") substrate which includes a silicon substrate 102, a buried oxide layer 104 (hereinafter "BOX SiO2") on the silicon substrate 102, and a thin silicon layer on the BOX SiO2 104. In other embodiments, the substrate may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate may be approximately, but is not limited to, several hundred microns thick.

The alternating layers of sacrificial semiconductor material and semiconductor channel material may include a stack sacrificial layer 108, covered by a sacrificial semiconductor material layer 110 (hereinafter "sacrificial layer"), covered by a semiconductor channel material layer 112 (hereinafter "channel layer"), covered by a sacrificial layer 110, covered by a channel layer 112, covered by a sacrificial layer 110, covered by a channel layer 112.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition technique, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth techniques include, for example, rapid thermal chemical vapor deposition (RT-CVD), low-energy plasma deposition (LEPD), ultra-high vacuum chemical vapor deposition (UHVCVD), low pressure chemical vapor deposition (LPCVD), atmospheric pressure chemical vapor deposition (APCVD) and molecular beam epitaxy (MBE). The temperature for epitaxial deposition typically ranges from approximately 550° C. to approximately 900° C. Although higher temperature typically results in faster deposition, the faster deposition may result in crystal defects and film cracking. The epitaxial growth the first and second semiconductor materials that provide the sacrificial semiconductor material layers and the semiconductor channel material layers, respectively, can be performed utilizing any well-known precursor gas or gas mixture. Carrier gases like hydrogen, nitrogen, helium and argon can be used.

Each sacrificial layer 110 is composed of a first semiconductor material which differs in composition from at least an upper portion of the BOX SiO2 104, the channel layer 112 and the stack sacrificial layer 108. In an embodiment, each sacrificial layer 110 may be a silicon-germanium semiconductor alloy and have a germanium concentration less than 50 atomic percent. In another example, each sacrificial layer 110 may have a germanium concentration ranging from about 20 atomic percent to about 40 atomic percent. Each sacrificial layer 110 can be formed using known deposition techniques or an epitaxial growth technique as described above.

Each channel layer 112 is composed of a second semiconductor material which differs in composition from at least the upper portion of the BOX SiO2 104, the sacrificial layer 110 and the stack sacrificial layer 108. Each channel layer 112 has a different etch rate than the first semiconductor material of sacrificial layer 110 and has a different etch rate than the stack sacrificial layer 108. The second semiconductor material can be, for example, silicon. The second semiconductor material, for each channel layer 112 can be formed using known deposition techniques or an epitaxial growth technique as described above.

The stack sacrificial layer 108, may, for example, be silicon germanium with a germanium concentration about 55 atomic percent, although percentages greater than 55 percent and less than 55 percent may be used. The stack sacrificial layer 108 can each be formed using an epitaxial growth technique. The stack sacrificial layer 108 will subsequently be removed selective to the remaining alternating layers, as described below. The thin silicon layer of the substrate may be converted to the stack sacrificial layer 108 by growing a high germanium concentration silicon germanium followed by a silicon germanium condensation process.

The alternating layers of sacrificial layer 110, channel layer 112 and stack sacrificial layer 108 can be formed by sequential epitaxial growth of alternating layers of the first semiconductor material, the second semiconductor material and the stack sacrificial layer material.

The sacrificial layers 110 may have a thickness ranging from about 5 nm to about 15 nm, and the channel layers 112 may have a thickness ranging from about 4 nm to about 12 nm. Each sacrificial layer 110 may have a thickness that is the same as, or different from, a thickness of each channel layer 112. In an embodiment, each sacrificial layer 110 has an identical thickness. In an embodiment, each channel layer 112 has an identical thickness. The stack sacrificial layer 108 may each have a thickness ranging from about 5 nm to about 12 nm.

Figure 4:
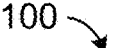
FIG. 4 illustrates a top view of the semiconductor structure and illustrated forming the semiconductor structure into nanosheet stacks, forming a sacrificial gate and forming a gate cap, according to an exemplary embodiment.
Figure 5:
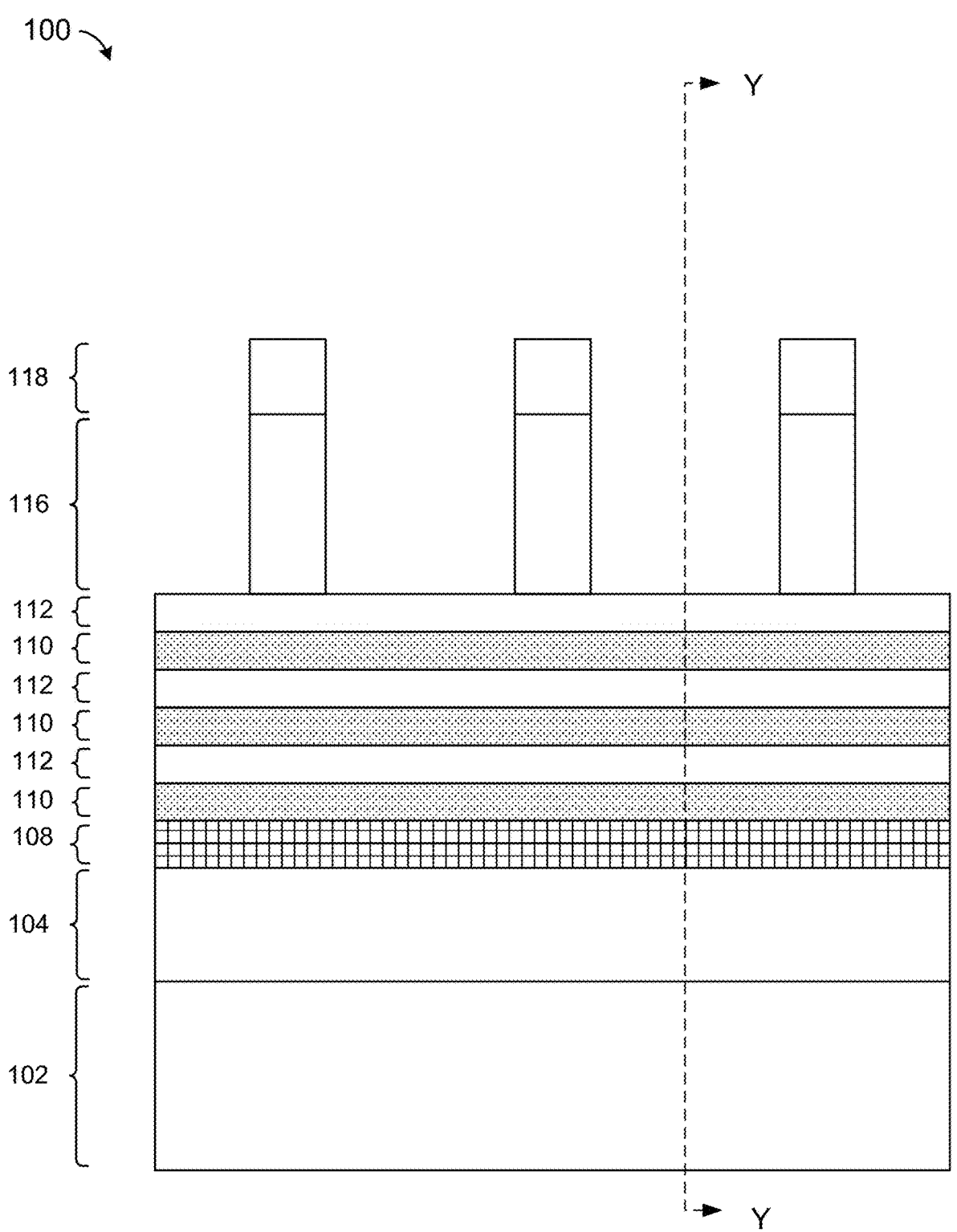
FIGS. 5 and 6 each illustrate a cross-sectional view of the semiconductor structure of FIG. 4 along section line X-X and Y-Y, respectively, according to an exemplary embodiment.
Figure 6:
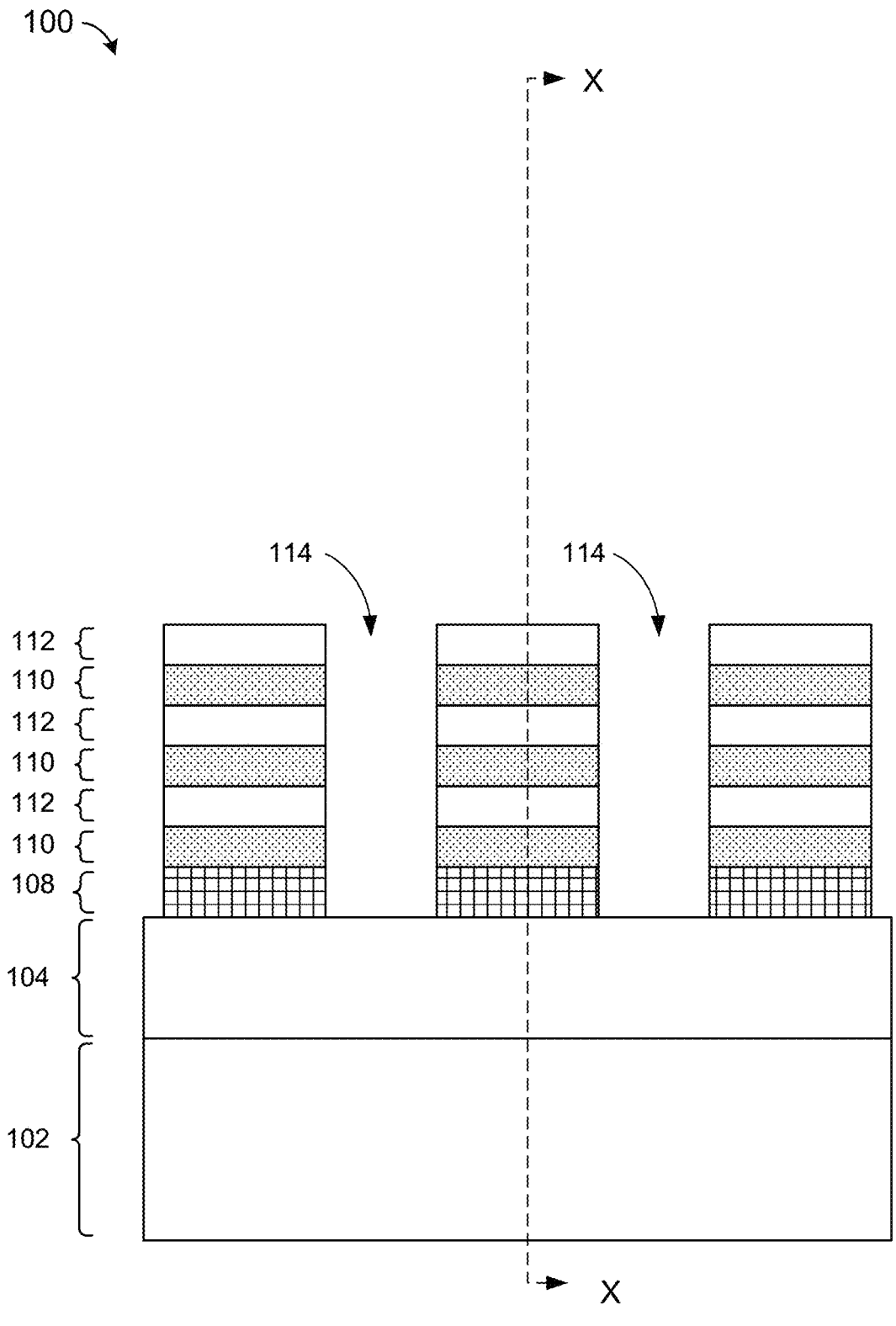

Referring now to FIGS. 4, 5 and 6, the structure 100 is shown according to an exemplary embodiment. FIG. 3 is a top view of the structure 100. FIGS. 4 and 5 are each a cross-sectional view of the structure 100 along section lines X-X and Y-Y, respectively. FIGS. 4 and 5 are perpendicular to each other. An active device region is defined by removing unwanted portions of nanosheets to form a trench 114. A sacrificial gate 116 and a gate cap 118 may be formed. Section X-X is along fins of the nanosheet stack, parallel to adjacent trenches 114 and perpendicular to the sacrificial gate 116. Section Y-Y is between adjacent sacrificial gates 116, parallel to the sacrificial gates 116 and perpendicular to the fins of the nanosheet stack.

The stack sacrificial layer 108 and the alternating layers of sacrificial layers 110 and channel layers 112 may be formed into fins, by methods known in the art. The fins may have a length perpendicular to section line Y-Y and parallel to section line X-X. The fins may be formed by methods known in the arts, and include steps such as forming a hard mask, on the alternating layers, patterning the hard mask, and subsequent formation of one or more trenches 114, by removal of portions of each layer of the stacked nanosheet. The trench 114 may form the nanosheet stack into fins by an anisotropic etching technique, such as, for example, reactive ion etching (RIE), and stopping on etching a portion of the BOX SiO2 104 between each nanosheet stack. The BOX SiO2 104 may provide physical and electrical isolation between adjacent nanosheet stacks.

Each fin of nanosheet stack may include a stack sacrificial layer 108, covered by a sacrificial layer 110, covered by a channel layer 112, covered by a sacrificial layer 110, covered by a channel layer 112, covered by a sacrificial layer 110, covered by a channel layer 112. By way of illustration, three fins are depicted in the drawings of the present application, although any number of fins may be formed.

The material stacks that can be employed in embodiments of the present invention are not limited to the specific embodiment illustrated in FIGS. 4, 5 and 6. In FIGS. 4, 5 and 6, and only by way of an example, the nanosheet stack includes three layers of sacrificial layers 110 alternating with three channel layers 112. The nanosheet stack can include any number of sacrificial layers 110 and channel layers 112. The nanosheet stack is used to produce a gate all around device that includes vertically stacked semiconductor channel material nanosheets for a p-FET or an n-FET.

The sacrificial gate 116 and the gate cap 118 are formed orthogonal (perpendicular) to the fins. By way of illustration, three sacrificial gates 116 are depicted in the drawings of the present application, although any number of sacrificial gates 116 may be formed. The sacrificial gate 116 may include a single sacrificial material or a stack of two or more sacrificial materials. The at least one sacrificial material can be formed by forming a blanket layer (or layers) of a material (or various materials) and then patterning the material (or various materials) by lithography and an etch. The sacrificial gate 116 can include any material including, for example, polysilicon, amorphous silicon, or multilayered combinations thereof. In an embodiment where amorphous silicon is used as a material for the sacrificial gate 116, a thin layer of SiO2 is deposited first to separate the nanosheet stack from the amorphous silicon. The sacrificial gate 116 can be formed using any deposition technique including, for example, chemical vapor deposition (CVD), physical vapor deposition (PVD), high density plasma (HDP) deposition, and spin on techniques. Optionally, the gate cap 118 may be formed as part of the sacrificial gate 116 in accordance with known techniques.

In an embodiment, the sacrificial gate 116 is deposited with a thickness sufficient to fill, or substantially fill, the spaces between adjacent nanosheet structures and cover a horizontal upper surface of the uppermost channel layer 112 of the nanosheet stack. The sacrificial gate 116 may be adjacent to vertical side surfaces of the nanosheet stack or fins. The sacrificial gate 116 may cover an upper horizontal surface of the BOX SiO2 104 between adjacent nanosheet stacks. A height of the sacrificial gate 116 may be much thicker than the underlying structure and may have a height between 100 nm and 150 nm about the nanosheet stack. The gate cap 118 may cover an upper horizontal surface of the sacrificial gate 116. Gate patterning may be performed by conventional lithography and etch process, such that portions of the gate cap 118 and portions of the sacrificial gate 116 are removed from a subsequently formed source drain region.

Figure 7:
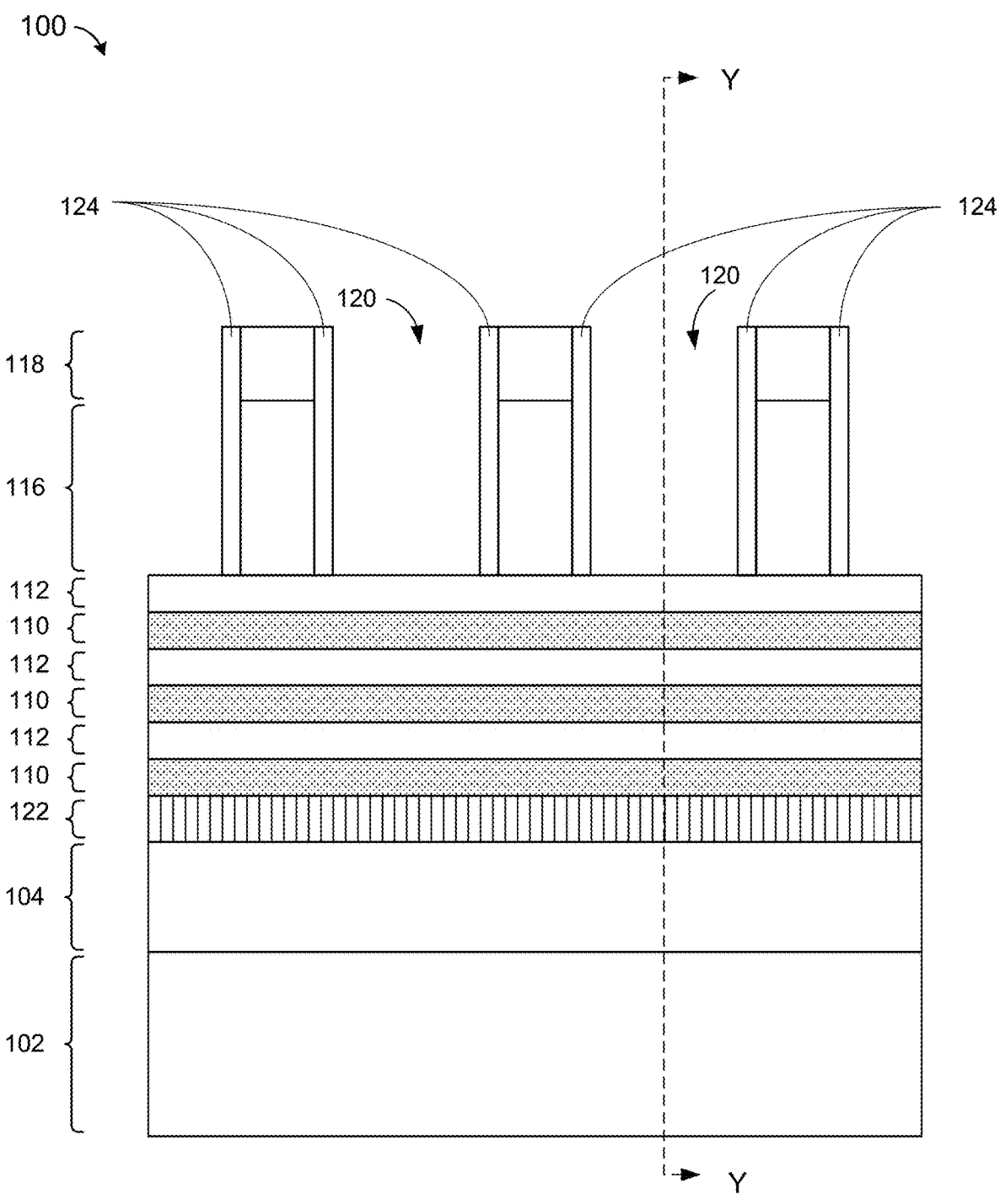
FIGS. 7 and 8 each illustrate a cross-sectional view of the semiconductor structure along section line X-X and Y-Y, respectively, and illustrate removal of a stack sacrificial layer and formation of a bottom dielectric isolation and a dielectric spacer, according to an exemplary embodiment.
Figure 8:
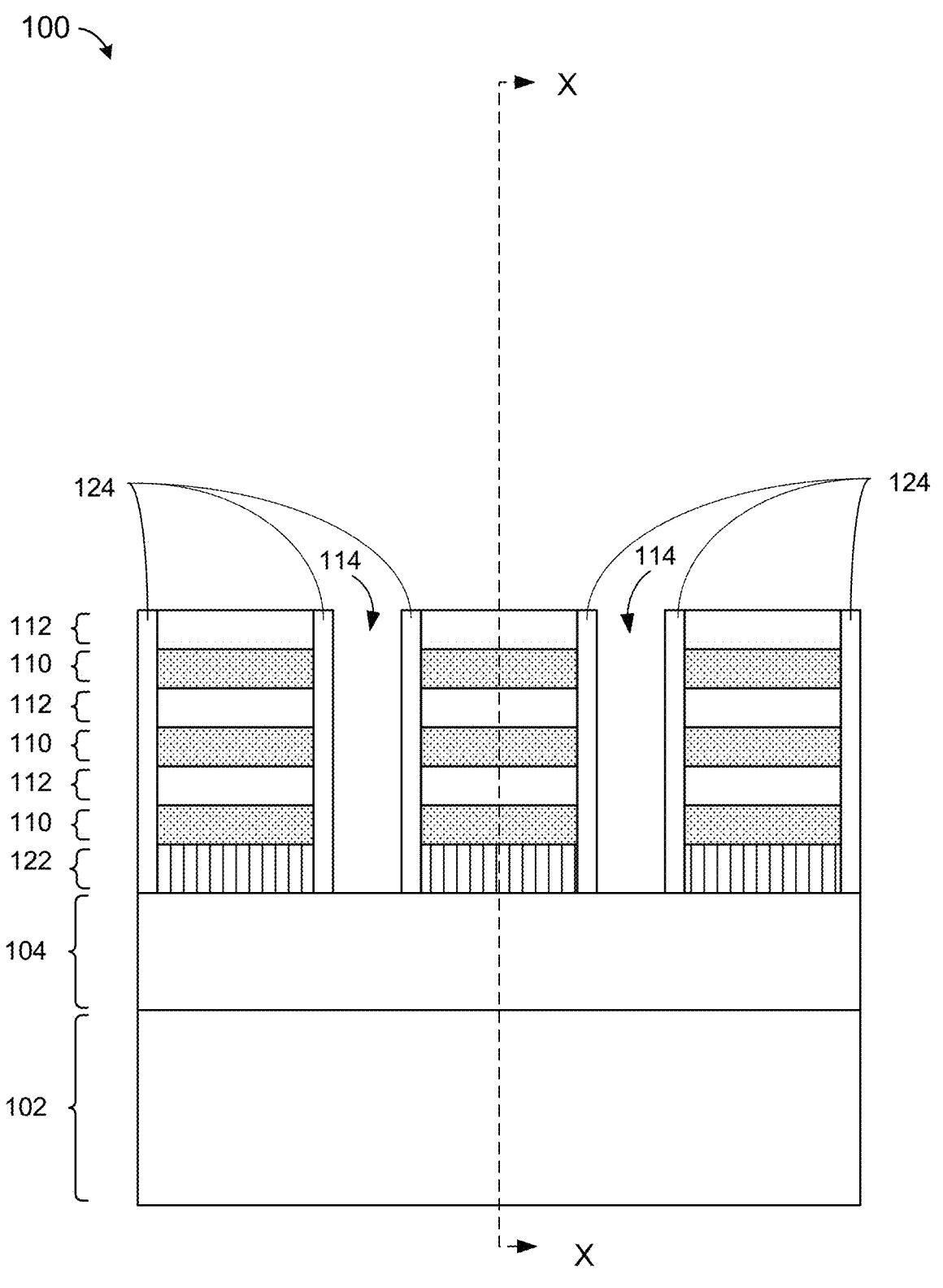

Referring now to FIGS. 7 and 8, the structure 100 is shown according to an exemplary embodiment. FIGS. 7 and 8 are each a cross-sectional view of the structure 100 along section lines X-X and Y-Y, respectively. FIGS. 7 and 8 are perpendicular to each other. The stack sacrificial layer 108 may be removed. A bottom dielectric isolation 122 (hereinafter "BDI") and a dielectric spacer 124 may be formed.

The stack sacrificial layer 108 may be selectively removed by methods known in the arts. For example, a dry etching technique can be used to selectively remove the stack sacrificial layer 108, such as, for example, using vapor phased HCl dry etch. The stack sacrificial layer 108 may be removed selective to the silicon substrate 102, the BOX SiO2 104, the channel layers 112, the sacrificial layers 110, the sacrificial gate 116 and the gate cap 118.

The BDI 122 may be formed where the stack sacrificial layer 108 was removed. The BDI 122 may be formed below a lowermost sacrificial layer 110 of the nanosheet stack and above the BOX SiO2 104.

The dielectric spacer 124 may be formed on vertical side surfaces of the nanosheet stack, including vertical side surfaces of the channel layers 112 and vertical side surfaces of the sacrificial layers 112. The dielectric spacer 124 may be formed on vertical side surfaces of the sacrificial gate 116 and the gate cap 118.

The BDI 122 and the dielectric spacer 124 may be formed by conformally depositing a dielectric material, followed by a combination of dry and wet anisotropic etch and recessing steps. The BDI 122 and the dielectric spacer 124 may be formed simultaneously or sequentially. The BDI 122 and the dielectric spacer 124 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the BDI 122 and the dielectric spacer 124 may each include one or more layers. The BDI 122 and dielectric spacer 124 may each include any dielectric material such as silicon nitride (SiN), silicon boron carbon nitride (SiBCN), silicon oxide carbon nitride (SiOCN), aluminum oxide (AlOx), and may include a single layer or may include multiple layers of dielectric material. The BDI 122 and the dielectric spacer 124 may each include the same material or different materials.

Figure 9:
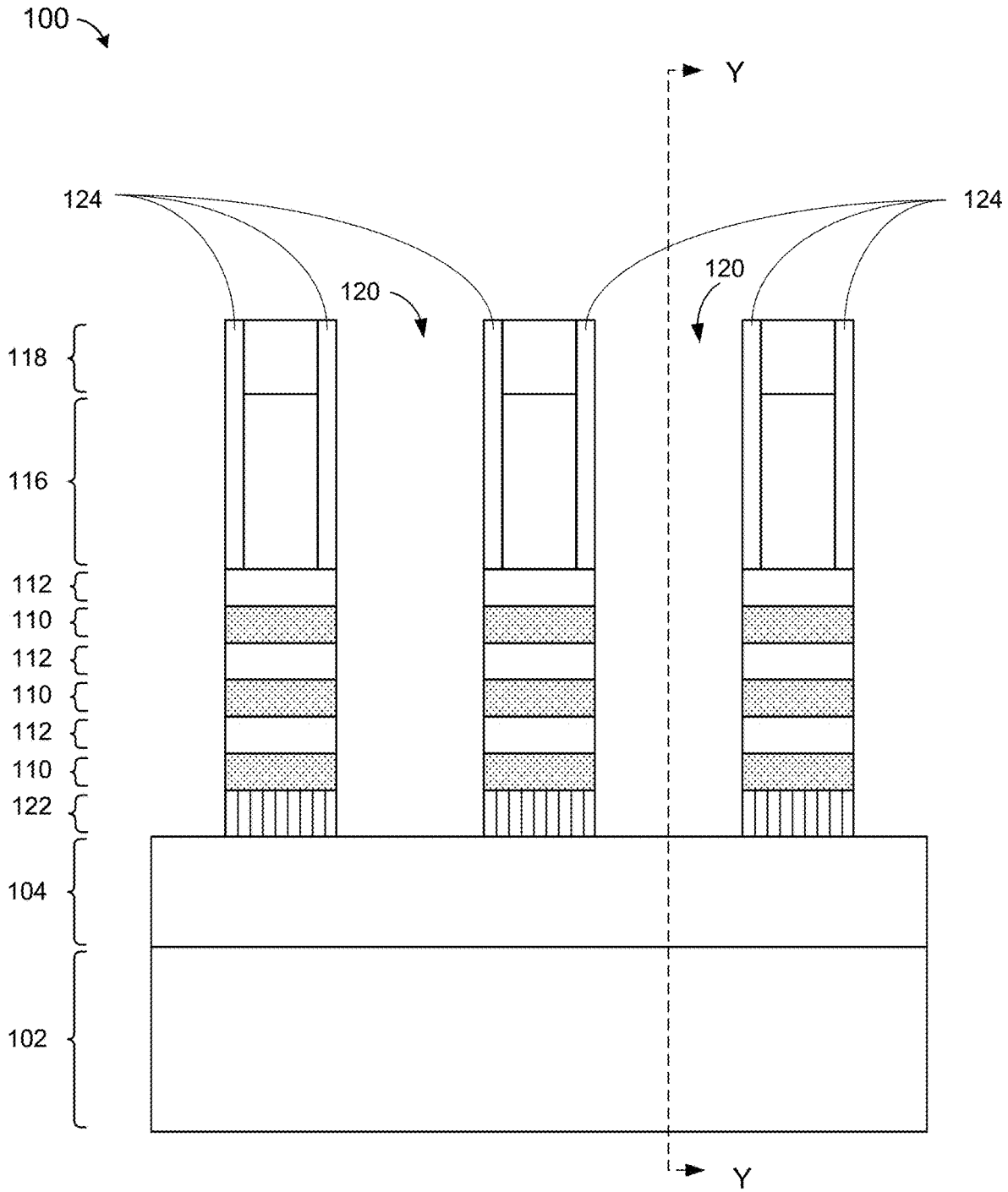
FIGS. 9 and 10 each illustrate a cross-sectional view of the semiconductor structure along section line X-X and Y-Y, respectively, and illustrate formation of a source/drain trench, according to an exemplary embodiment.
Figure 10:
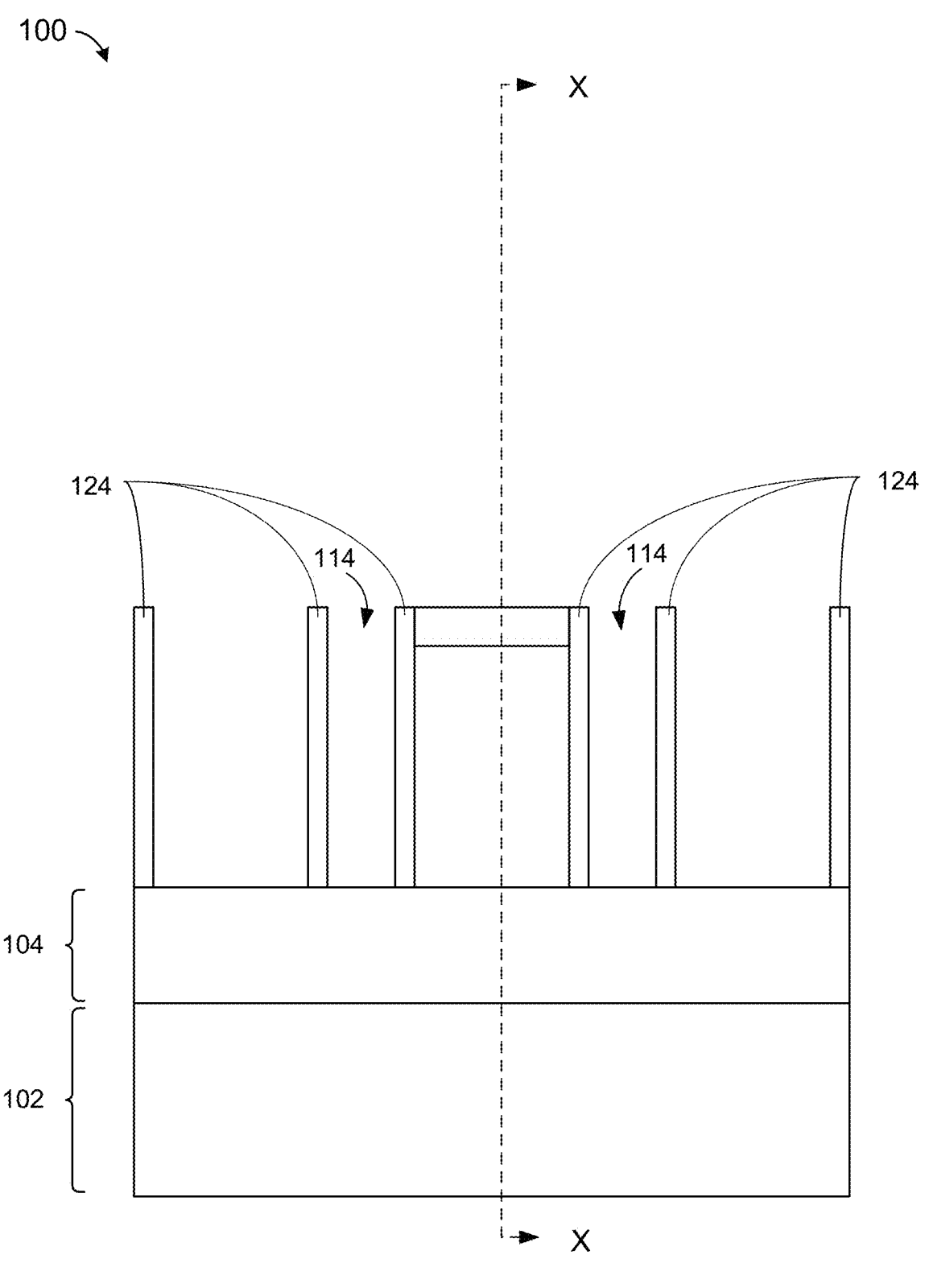

Referring now to FIGS. 9 and 10, the structure 100 is shown according to an exemplary embodiment. FIGS. 9 and 10 are each a cross-sectional view of the structure 100 along section lines X-X and Y-Y, respectively. FIGS. 9 and 10 are perpendicular to each other. A source/drain trench 120 may be formed.

The alternating layers of sacrificial layers 110, channel layers 112 and the BDI 122 may be formed into nanosheet stacks, by methods known in the art. The source/drain trench 120 may have a length perpendicular to section line X-X and parallel to section line Y-Y, and perpendicular to the fins. The source/drain trench 120 may be formed between each sacrificial gate 116 with surrounding dielectric spacers 124 by an anisotropic etching technique, such as, for example, reactive ion etching (RIE), and stopping on etching a portion of the BOX SiO2 104 between each nanosheet stack. The BOX SiO2 104 may provide physical and electrical isolation between adjacent nanosheet stacks.

Each nanosheet stack may include a BDI 122, covered by a sacrificial layer 110, covered by a channel layer 112, covered by a sacrificial layer 110, covered by a channel layer 112, covered by a sacrificial layer 110, covered by a channel layer 112. Above the nanosheet stack is the sacrificial gate 116 and the gate cap 118, with the dielectric spacer 124 on opposite vertical sides. The nanosheet stack may be vertically aligned with the dielectric spacer 124 surrounding the sacrificial gate and the gate cap 118.

As shown in FIG. 10, the nanosheet stack may be removed between adjacent sacrificial gates 116, gate cap 118 and dielectric spacers 124. The dielectric spacer 124 may remain vertically where the nanosheet stack was removed along section line X-X.

Figure 11:
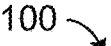
FIG. 11 illustrates a top view of the semiconductor structure and illustrates formation of a backside contact trench, according to an exemplary embodiment.
Figure 12:
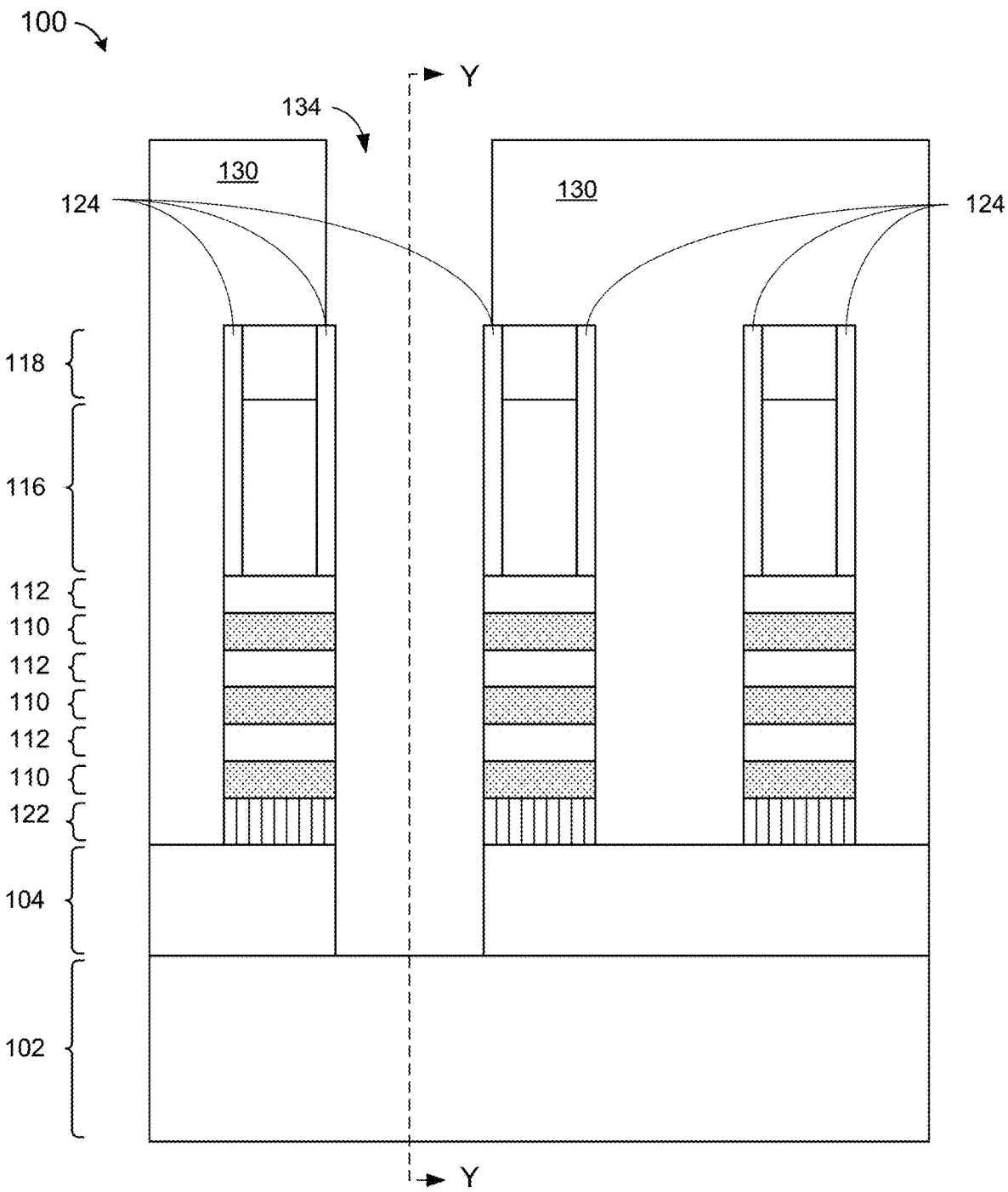
FIGS. 12 and 13 each illustrate a cross-sectional view of the semiconductor structure of FIG. 11 along section line X-X and Y-Y, respectively, according to an exemplary embodiment.
Figure 13:
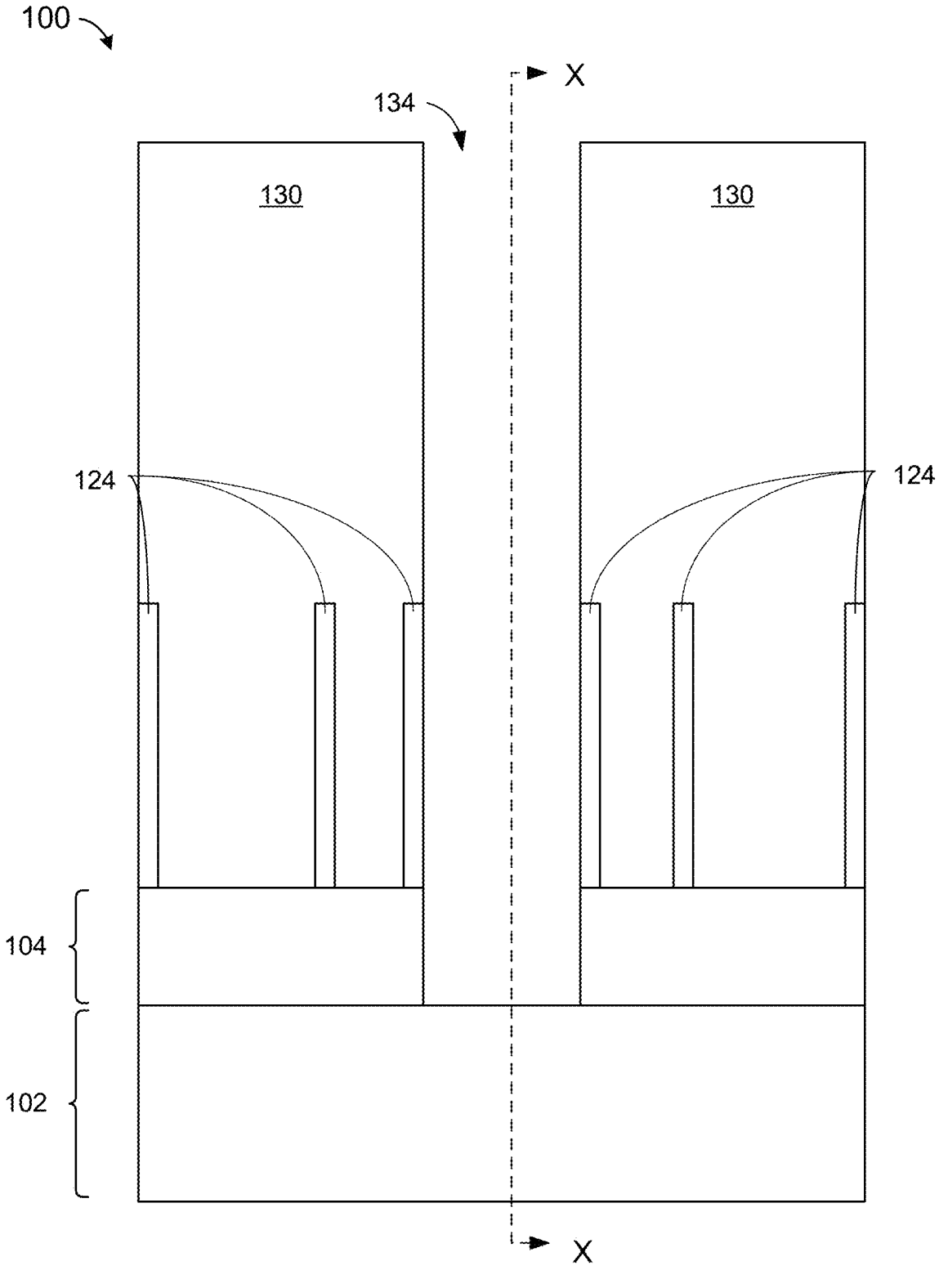

Referring now to FIGS. 11, 12 and 13, the structure 100 is shown according to an exemplary embodiment. FIG. 11 is a top view of the structure 100. FIGS. 12 and 13 are each a cross-sectional view of the structure 100 along section lines X-X and Y-Y, respectively. FIGS. 12 and 13 are perpendicular to each other. A backside contact trench 134 may be patterned in the BOX SiO2 104 using conventional lithography and etching process. A lithography soft mask, such as an organic planarization layer 130 (hereinafter "OPL") may be used for the patterning process.

The OPL 130 may be formed by a blanket deposition using typical deposition techniques, for example spin-on coating. The OPL 130 can be a self-planarizing organic material that includes carbon, hydrogen, oxygen, and optionally nitrogen, fluorine, and silicon. The OPL 130 can be a standard $C_xH_y$ polymer. Non-limiting examples of materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

A dry etch technique may be used to selectively remove a portion of the OPL 130 which is subsequently used to form the backside contact trench 134.

The backside contact trench 134 may be formed between an adjacent pair of sacrificial gates 116, gate cap 118 and dielectric spacers 124 surrounding each sacrificial gate 116, above adjacent nanosheet stacks, as shown in the section line X-X of FIG. 12. The backside contact trench 134 may be formed between a pair of dielectric spacers 124 where a nanosheet stack was removed between adjacent sacrificial gates 116, as shown in the section line Y-Y of FIG. 13.

The backside contact trench 134 may be formed by an anisotropic etching technique, such as, for example, reactive ion etching (RIE), removing aligned portions of the OPL 130 and the BOX SiO2 104, and stopping on etching a portion of the silicon substrate 102.

A subsequently formed source drain epitaxy may be formed over a sacrificial layer, both in the backside contact trench 134. The sacrificial layer formed in the backside contact trench can facilitate forming a self-aligned backside contact over the subsequently formed source drain epitaxy.

The backside contact trench 134 may be formed in select areas of the structure 100 where a future bottom contact may be formed to a subsequently formed source drain. There may be one or more backside contact trenches 134 on the structure 100.

Figure 14:
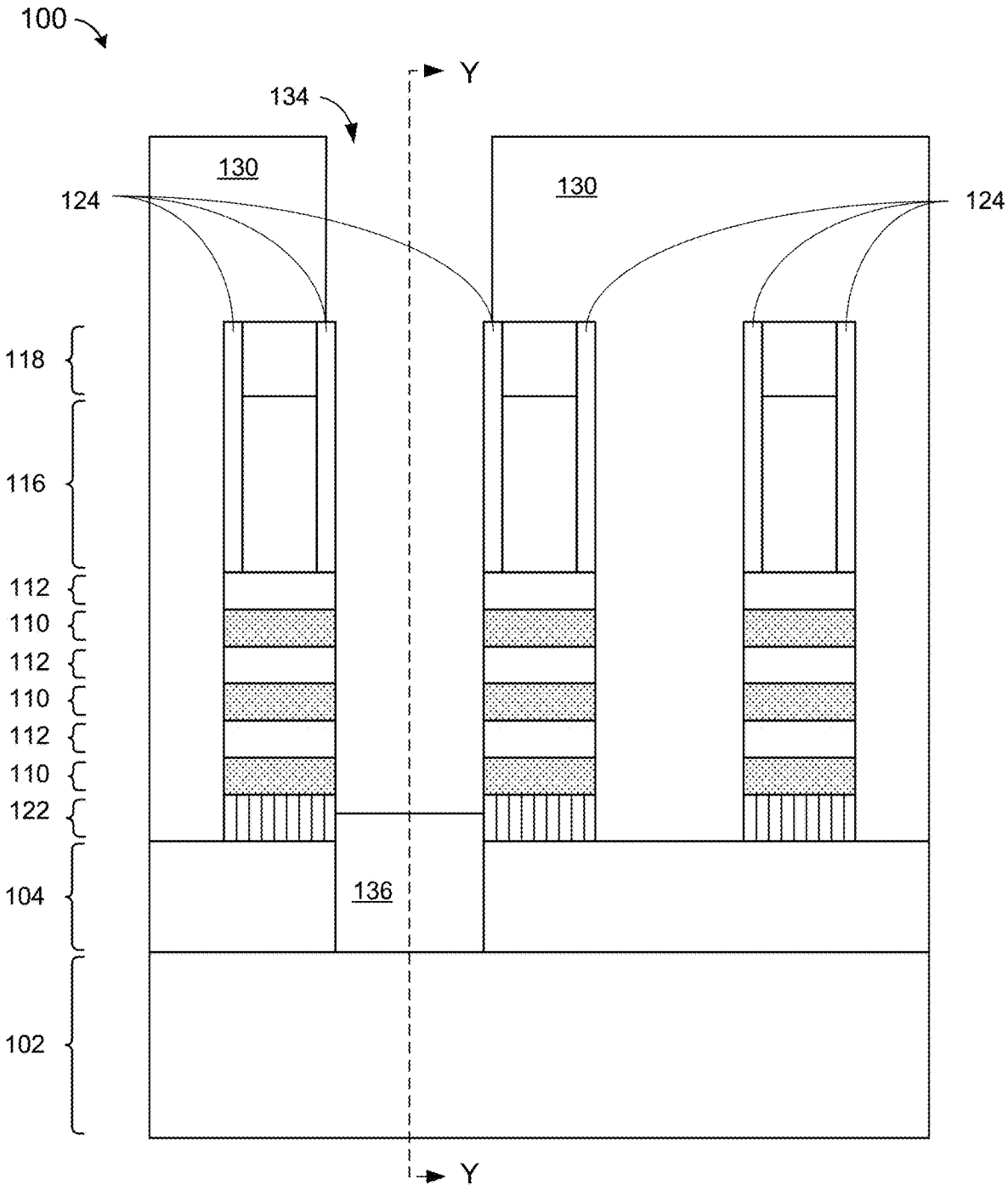
FIGS. 14 and 15 each illustrate a cross-sectional view of the semiconductor structure along section line X-X and Y-Y, respectively, and illustrate formation of a sacrificial backside contact placeholder, according to an exemplary embodiment.
Figure 15:
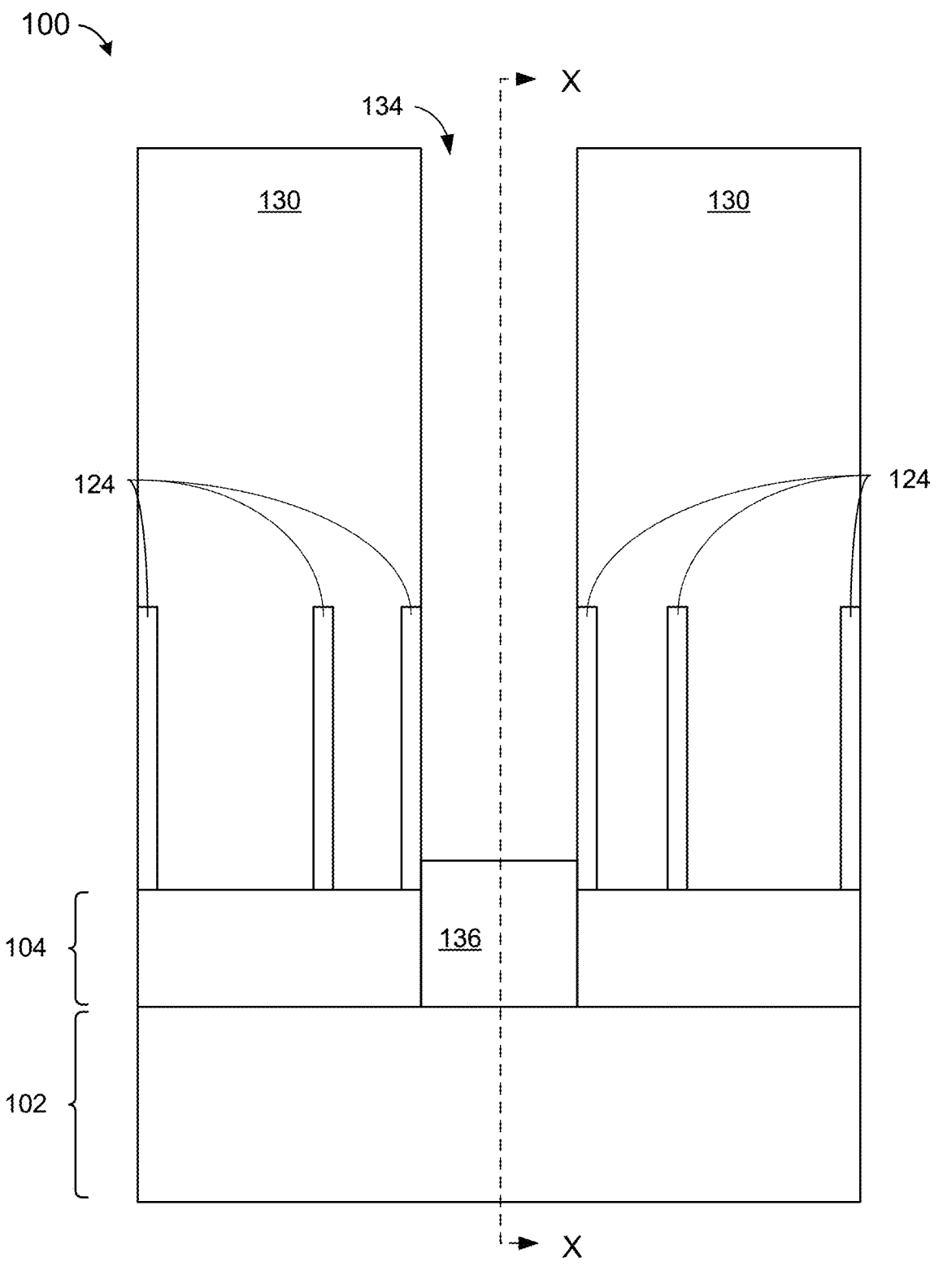

Referring now to FIGS. 14 and 15, the structure 100 is shown according to an exemplary embodiment. FIGS. 14 and 15 are each a cross-sectional view of the structure 100 along section lines X-X and Y-Y, respectively. FIGS. 14 and 15 are perpendicular to each other. A sacrificial backside contact placeholder 136 may be formed.

The sacrificial backside contact placeholder 136 may be formed in the backside contact trench 134, filling a portion of the backside contact trench 134. A lower surface of the sacrificial backside contact placeholder 136 may be adjacent to an upper surface of the silicon substrate 102. Vertical side surfaces of the sacrificial backside contact placeholder 136 may be adjacent to vertical side surfaces of the BOX SiO2 104. A portion of the vertical side surfaces of the sacrificial backside contact placeholder 136 may be adjacent to a portion of vertical side surfaces of the dielectric spacer 124 which surround the backside contact trench 134. A portion of the vertical side surfaces of the sacrificial backside contact placeholder 136 may be adjacent to a portion of a vertical side surface of the BDI 122.

The sacrificial backside contact placeholder 136 may be formed by conformally depositing or growing a dielectric material, followed by a combination of dry and wet anisotropic etch and recessing steps. The sacrificial backside contact placeholder 136 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the sacrificial backside contact placeholder 136 may include one or more layers. In an embodiment, the sacrificial backside contact placeholder 136 may include any material that can be selectively removed layer with respect to the BOX SiO2 104, such as silicon oxynitride, silicon nitride, SiBCN, SiOC, SiC, AlOx, TiOx or any combination of these materials.

Figure 16:
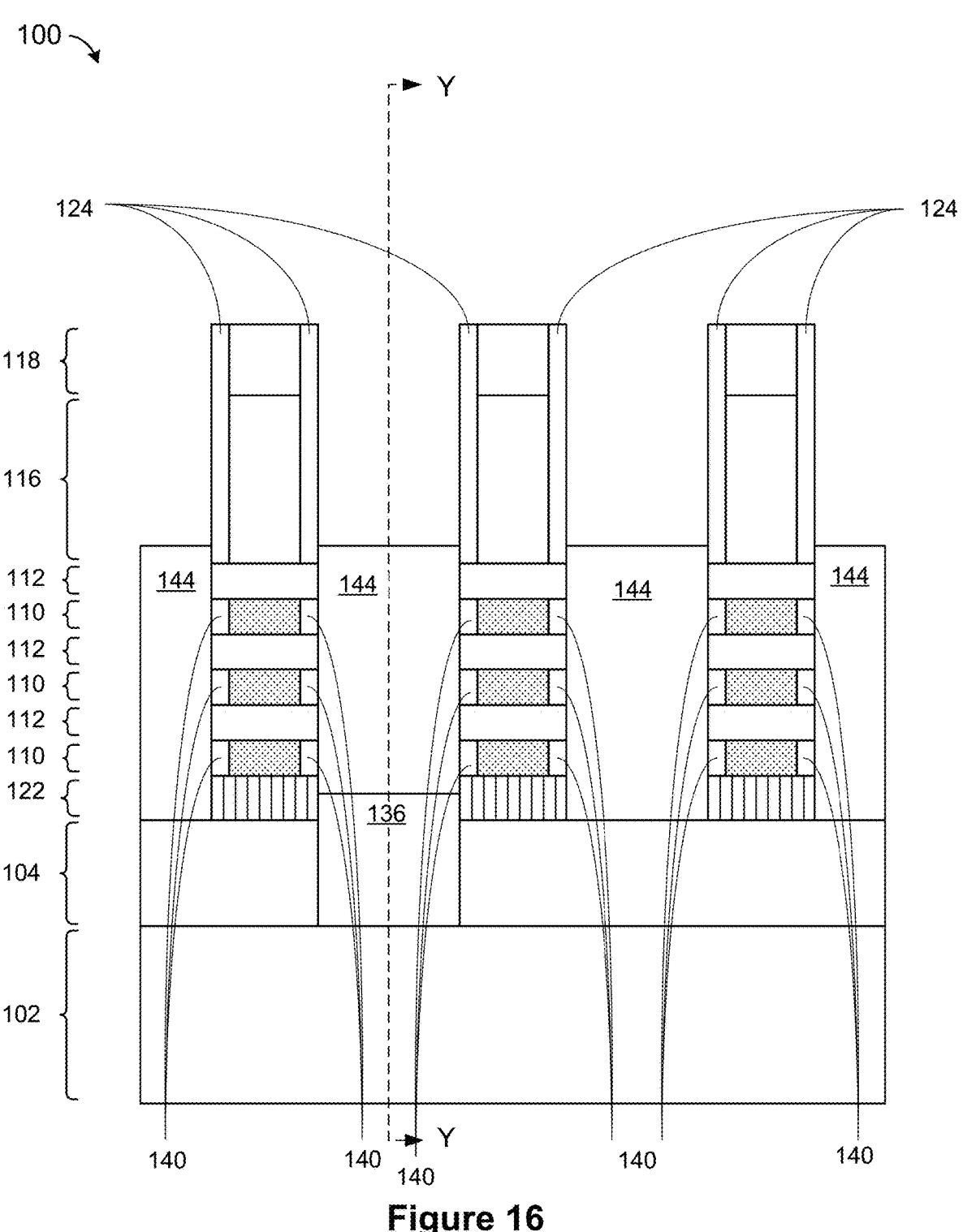
FIGS. 16 and 17 each illustrate a cross-sectional view of the semiconductor structure along section line X-X and Y-Y, respectively, and illustrate removal of the organic patterning layer and formation of inner spacers and a source drain, according to an exemplary embodiment.
Figure 17:
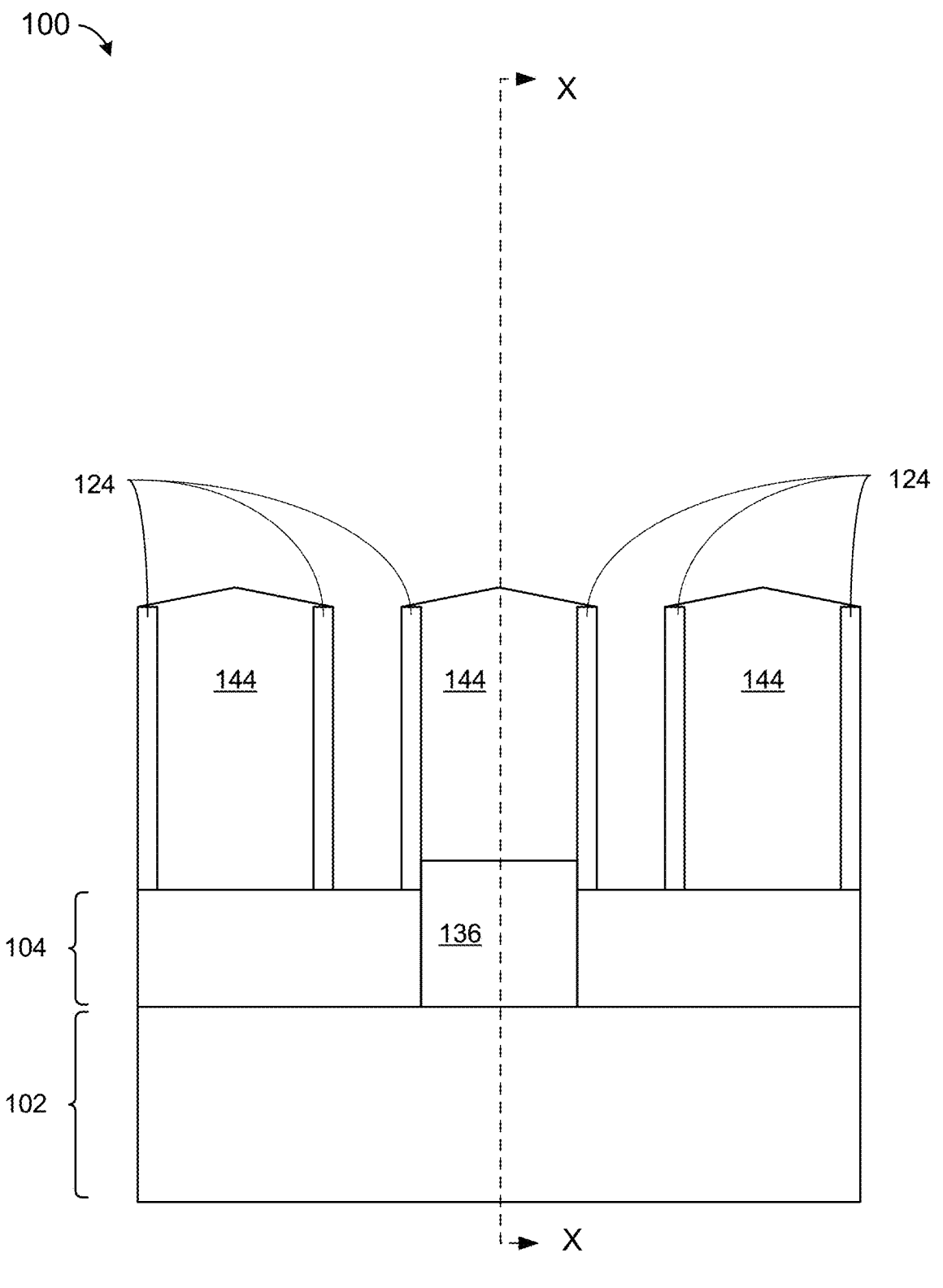

Referring now to FIGS. 16 and 17, the structure 100 is shown according to an exemplary embodiment. FIGS. 16 and 17 are each a cross-sectional view of the structure 100 along section lines X-X and Y-Y, respectively. FIGS. 16 and 17 are perpendicular to each other. The OPL 130 may be removed. Outer portions of the sacrificial layers 110 may be removed. Inner spacers 140 may be formed. A source drain 144 may be formed.

A wet etching or dry ashing technique may be used to selectively remove the OPL 130 selective to the silicon substrate 102, the BOX SiO2 104, the sacrificial layers 110, the channel layers 112, the sacrificial gate 116, the gate cap 118, the BDI 122, the dielectric spacer 124 and the sacrificial backside contact placeholder 136.

Outer portions of the sacrificial layers 110 may be selectively removed using known techniques. For example, a wet or dry etch process can be used with the appropriate chemistry to remove portions of each of the sacrificial layers 110. The material used for the etching process may be selective such that the channel layers 112, the sacrificial backside contact placeholder 136, the dielectric spacer 124, the BDI 122, the gate cap 118, the sacrificial gate 116, the channel layers 112, the BOX SiO2 104 and the silicon substrate 102 remain and are not etched. After etching, portions of the sacrificial layers 110 covered on opposite sides by the sacrificial gate 116 may remain as part of the nanosheet stack.

The inner spacer 140 may be formed by conformally depositing or growing a dielectric material, followed by a combination of dry and wet isotropic etch and recessing steps. The inner spacer 140 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an isotropic etch process such as a wet etch process, or any suitable etch process. In an embodiment, the inner spacer 140 may include one or more layers. In an embodiment, the inner spacer 140 may include any dielectric material such as, silicon oxynitride, silicon nitride, SiBCN, SiOC, or any combination of these materials.

The inner spacer 140 may completely fill in spaces between the channel layers 112, where the portions of the sacrificial layers 110 had been previously removed.

A vertical side surface of the inner spacer 140 may be aligned with a vertical side surface of the channel layers 112 and a vertical side surface of the dielectric spacer 124 surrounding the sacrificial gate 116 and the gate cap 118.

The source drain 144 may be epitaxially grown surrounding a vertical portion of the nanosheet stack on opposite sides of the sacrificial gate 116. A lower surface of the source drain 144 may be adjacent to an upper surface of the sacrificial backside contact placeholder 136. A lower surface of the source drain 144 may be adjacent to an upper surface of the BOX SiO2 104, in those areas without the sacrificial backside contact placeholder 136. A vertical side surface of the source drain 144 may be adjacent to vertical side surfaces of the inner spacer 140, vertical side surfaces of the BDI 122 and vertical side surfaces of the channel layers 112. An upper surface of the source drain 144 may be a greater distance from the BOX SiO2 104 than an upper surface of the uppermost channel layer 112.

Figure 18:
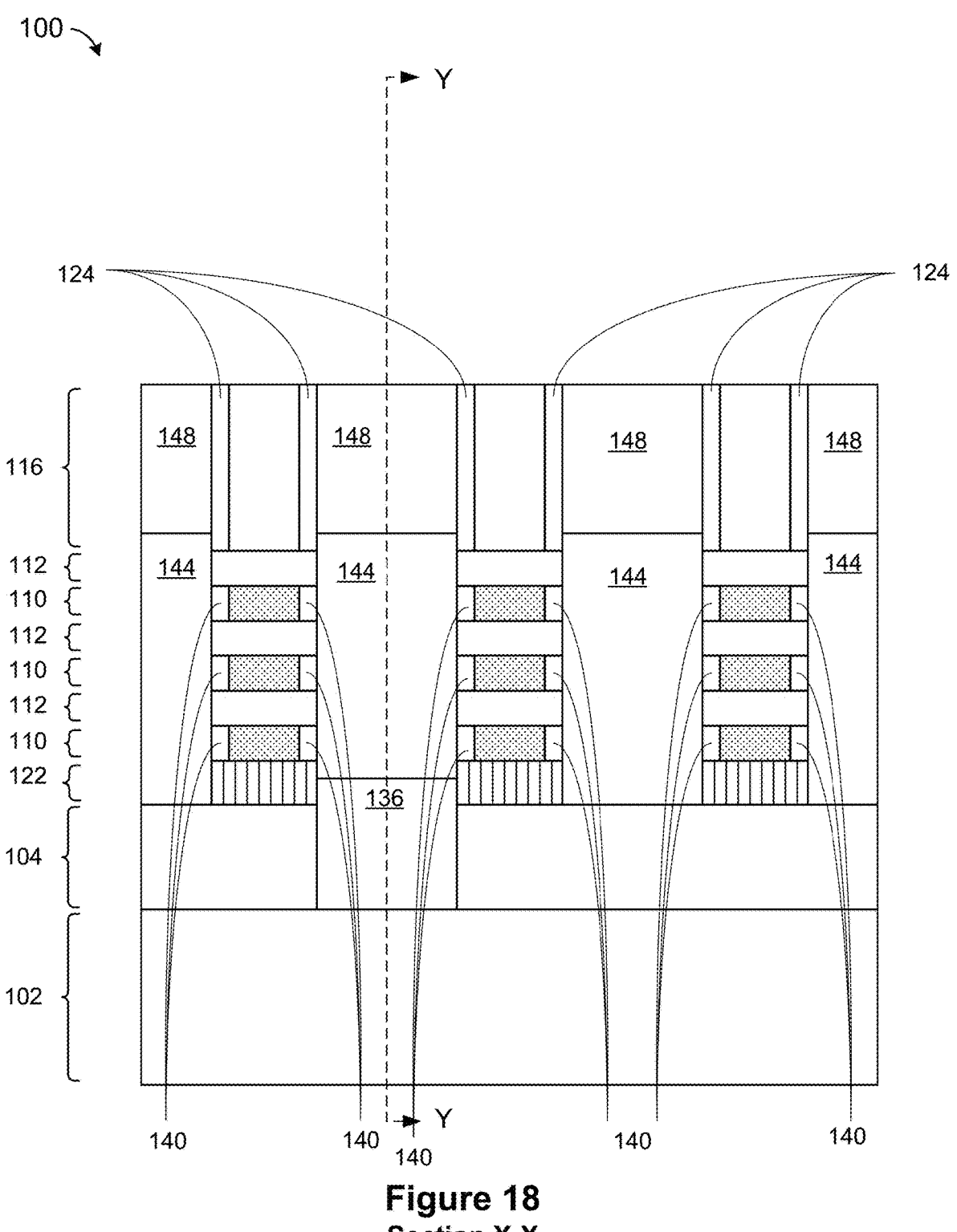
FIGS. 18 and 19 each illustrate a cross-sectional view of the semiconductor structure along section line X-X and Y-Y, respectively, and illustrate formation of an inter-layer dielectric, according to an exemplary embodiment.
Figure 19:
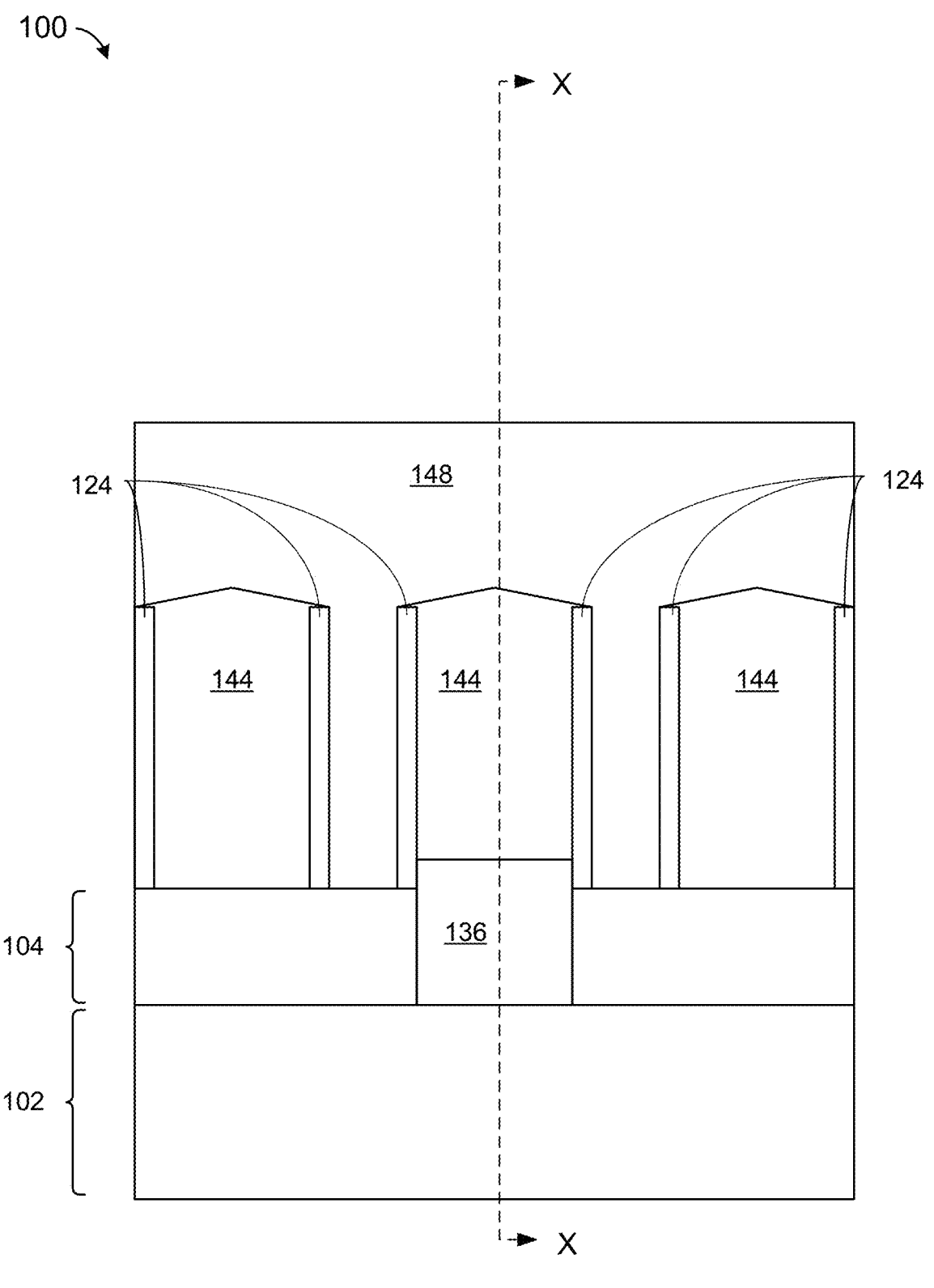

Referring now to FIGS. 18 and 19, the structure 100 is shown according to an exemplary embodiment. FIGS. 18 and 19 are each a cross-sectional view of the structure 100 along section lines X-X and Y-Y, respectively. FIGS. 18 and 19 are perpendicular to each other. An inter-layer dielectric (hereinafter "ILD") 148 may be formed.

The ILD 148 may be formed by conformally depositing or growing a dielectric material, followed by a CMP or etch steps. The ILD 148 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by a planarization process, such as CMP, or any suitable etch process. In an embodiment, the ILD 148 may include one or more layers. In an embodiment, the ILD 148 may include any dielectric material such as silicon oxide, silicon oxynitride, silicon nitride, SiBCN, SiOC, low-k dielectric or any combination of these materials. A lower surface of the ILD 148 may be adjacent to an upper surface of the source drain 144. An additional lower surface of the ILD 148 may be adjacent to an upper surface of the box 104. A vertical side surface of the ILD 148 may be adjacent to a vertical side surface of the dielectric spacer 124.

A chemical mechanical polishing (CMP) technique may be used to remove excess material and polish upper surfaces of the structure 100, removing the gate cap 118 and exposing an upper horizontal surface of the sacrificial gate 116. An upper surface of the structure 100 may also include an upper horizontal surface of the ILD 148 and an upper horizontal surface of the dielectric spacer 124.

Figure 20:
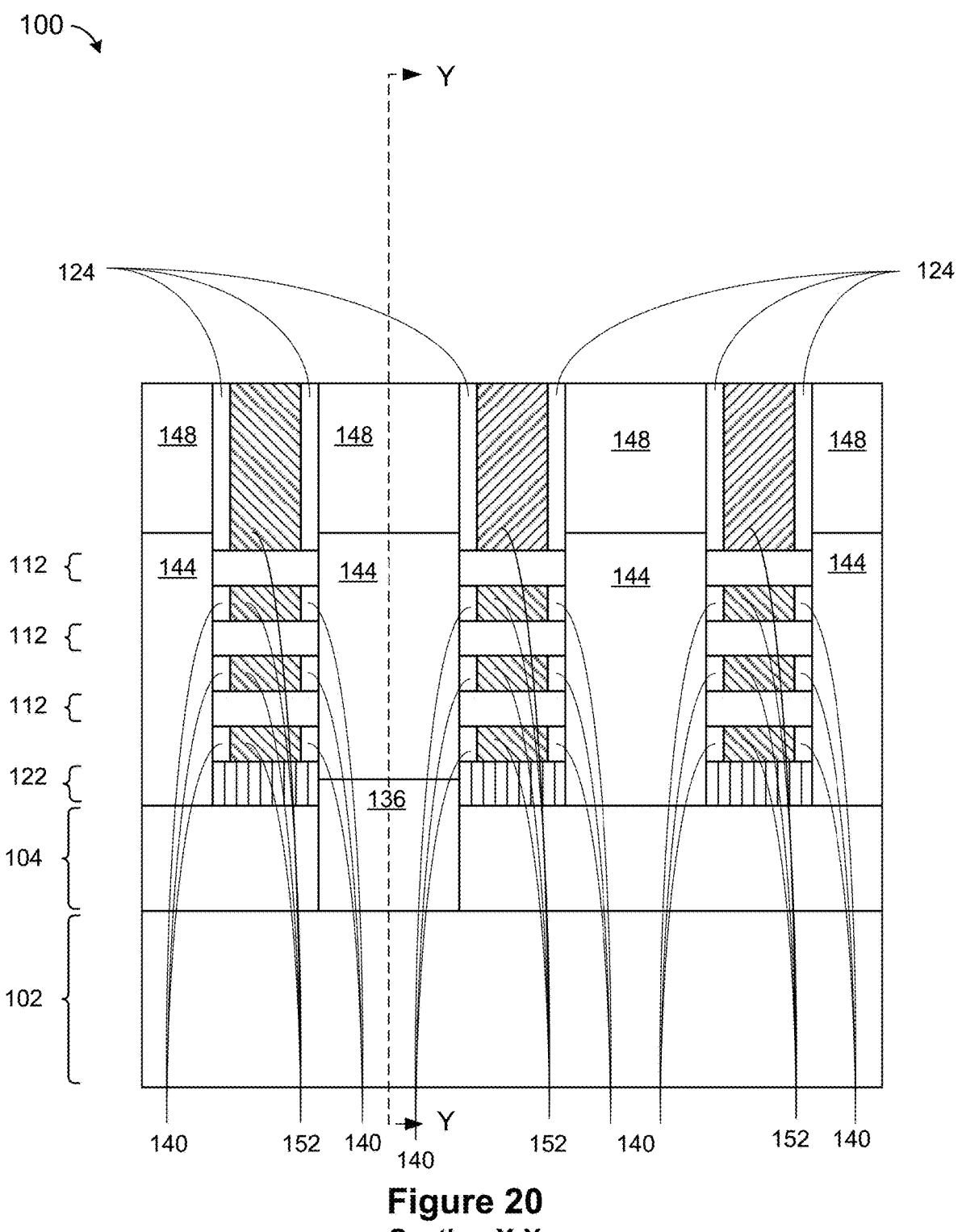
FIGS. 20 and 21 each illustrate a cross-sectional view of the semiconductor structure along section line X-X and Y-Y, respectively, and illustrate removal of the sacrificial gate and the sacrificial layers and formation of a replacement high-k metal gate, according to an exemplary embodiment.
Figure 21:
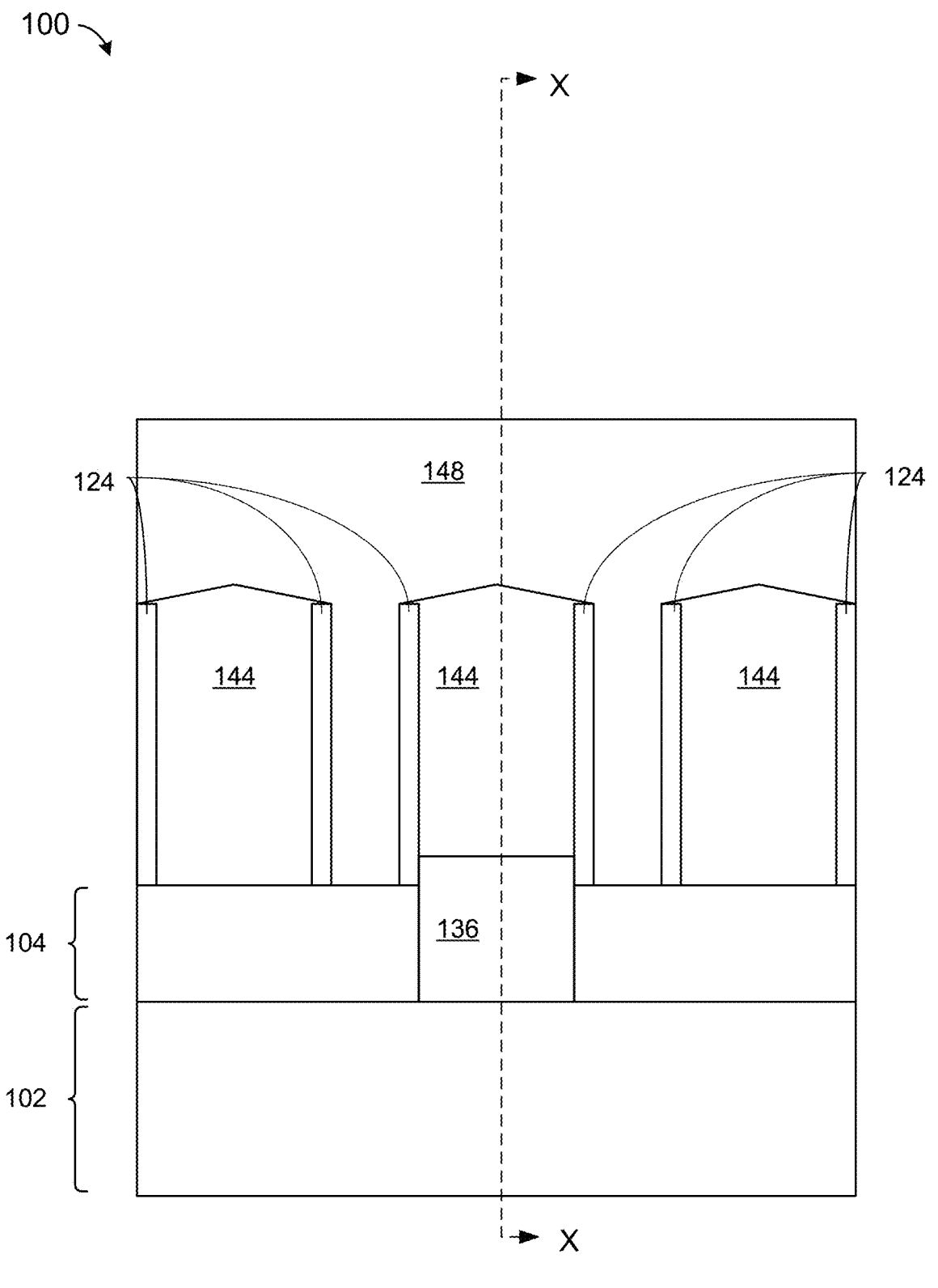

Referring now to FIGS. 20 and 21, the structure 100 is shown according to an exemplary embodiment. FIGS. 20 and 21 are each a cross-sectional view of the structure 100 along section lines X-X and Y-Y, respectively. FIGS. 20 and 21 are perpendicular to each other. The sacrificial gate 116 may be removed. The sacrificial layers 110 may be removed. A replacement high-k metal gate 152 may be formed.

The sacrificial gate 116 may be removed by methods known in the arts. The sacrificial layers 110 are removed selective to the channel layers 112, the inner spacers 140, the ILD 148, the dielectric spacer 124, the BDI 122, the sacrificial backside contact placeholder 136, the BOX SiO2 104 and the silicon substrate 102. For example, a dry etch process can be used to selectively remove the sacrificial layers 110, such as using vapor phased HCl dry etch. An upper surface and a lower surface of the channel layers 112 may be exposed. An upper surface of the BDI 122 may be exposed.

The high-k metal gate 152 may be conformally formed on the structure 100, according to an exemplary embodiment. The high-k metal gate 152 is formed in each cavity of the nanosheet stack and surrounding suspended portions of the channel layers 112. The high-k metal gate 152 forms a layer surrounding exposed portions of the nanosheet stacks. The high-k metal gate 152 may cover an exposed upper horizontal surface of the BDI 122, exposed vertical side surfaces of one side of the side spacers 140, exposed vertical surfaced of one side of the dielectric spacer 124 and the exposed upper horizontal surfaces of the BDI 122. The high-k metal gate 152 may cover vertical side surfaces, an upper horizontal surface and a lower horizontal surface of the channel layers 110. The high-k metal gate 152 may fill a space between the dielectric spacer 124 above the nanosheet stack, where the sacrificial gate 116 was removed.

The high-k metal gate 152 may be deposited using typical deposition techniques, for example, atomic layer deposition (ALD), molecular layer deposition (MLD), and chemical vapor deposition (CVD). In an embodiment, the high-k metal gate 152 may include more than one layer, for example, a conformal layer of a high-k dielectric material such as HfO$_2$, ZrO$_2$, La$_2$O$_3$, Al$_2$O$_3$, TiO$_2$, SrTiO$_3$, LaAlO$_3$, Y$_2$O$_3$, HfO$_x$N$_y$, ZrO$_x$N$_y$, La$_2$O$_x$N$_y$, Al$_2$O$_x$N$_y$, TiO$_x$N$_y$, SrTiO$_x$N$_y$, LaAlO$_x$N$_y$, Y$_2$O$_x$N$_y$, SiON, SiN$_x$, a silicate thereof, and an alloy thereof. In an embodiment, a work function metal of a p-FET device may include a metal nitride, for example, titanium nitride or tantalum nitride, titanium carbide titanium aluminum carbide, or other suitable materials known in the art. In an embodiment, the work function metal of an n-FET device may include, for example, titanium aluminum carbide or other suitable materials known in the art. In an embodiment, the work function metal may include one or more layers to achieve desired device characteristics.

A chemical mechanical polishing (CMP) technique may be used to remove excess material and polish upper surfaces of the structure 100. An upper surface of the structure 100 may include an upper horizontal surface of the ILD 148, an upper horizontal surface of the dielectric spacer 124 and an upper horizontal surface of the high-k metal gate 152.

Figure 22:
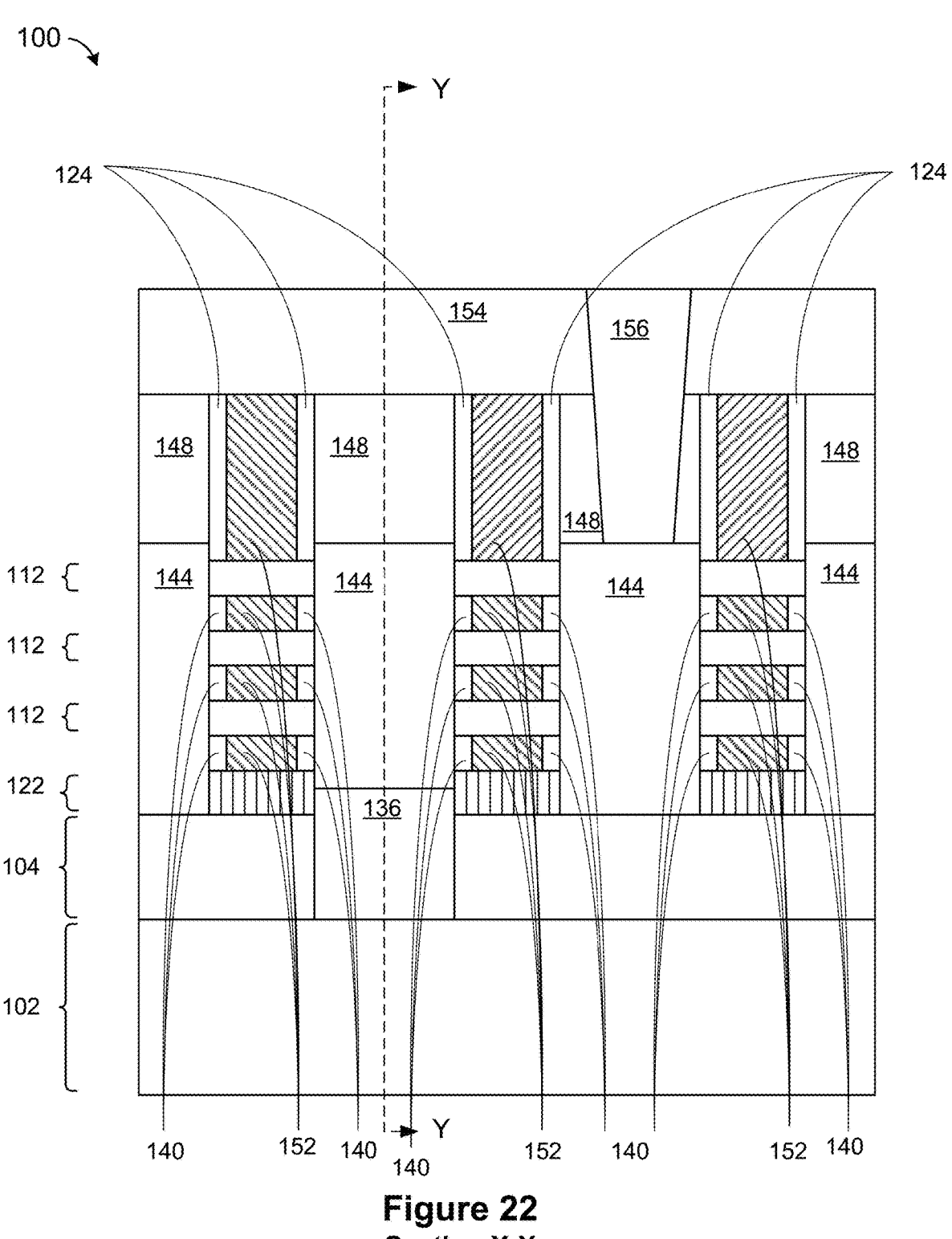
FIGS. 22 and 23 each illustrate a cross-sectional view of the semiconductor structure along section line X-X and Y-Y, respectively, and illustrate formation of an inter-layer dielectric and a contact, according to an exemplary embodiment.
Figure 23:
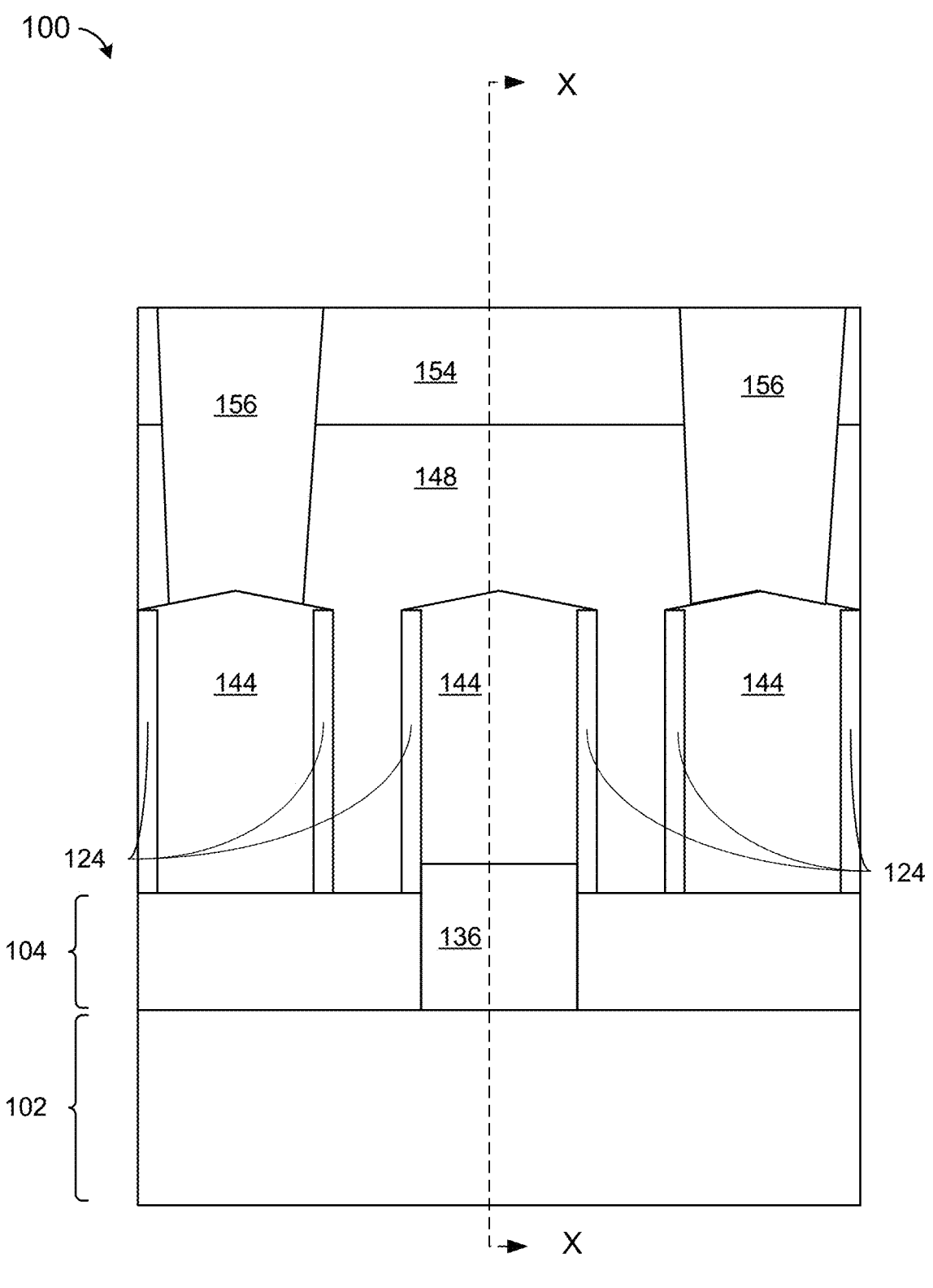

Referring now to FIGS. 22 and 23, the structure 100 is shown according to an exemplary embodiment. FIGS. 22 and 23 are each a cross-sectional view of the structure 100 along section lines X-X and Y-Y, respectively. FIGS. 22 and 23 are perpendicular to each other. An inter-layer dielectric (hereinafter "ILD") 154 may be formed. A contact 156 may be formed.

The ILD 154 may be conformally formed as described for the ILD 148. A lower horizontal surface of the ILD 154 may be adjacent to an upper horizontal surface of the high-k metal gate 152, an upper horizontal surface of the dielectric spacer 124 and an upper horizontal surface of the ILD 148.

An opening (not shown) may be made in the structure 100 through the ILD 154 and the ILD 148 exposing an upper horizontal surface of the source drain 144. A contact 156 may be formed in the opening (not shown) to form a contact to the source drain 144. As shown in FIG. 23, there are 2 contacts 156. There may be any number of contacts 156 on the structure 100.

The contacts 156 may be made to the source drain 144 which does not have a sacrificial backside contact placeholder 136 below the source drain 144. The source drain 144 which has a sacrificial backside contact placeholder 136 may have a bottom contact as formed in later processing steps. Each of the source drains 144 may have either a contact 156 or a bottom contact.

A chemical mechanical polishing (CMP) technique may be used to remove excess material and polish upper surfaces of the structure 100, exposing an upper horizontal surface of the ILD 154 and an upper horizontal surface of the contact 156.

Figure 24:
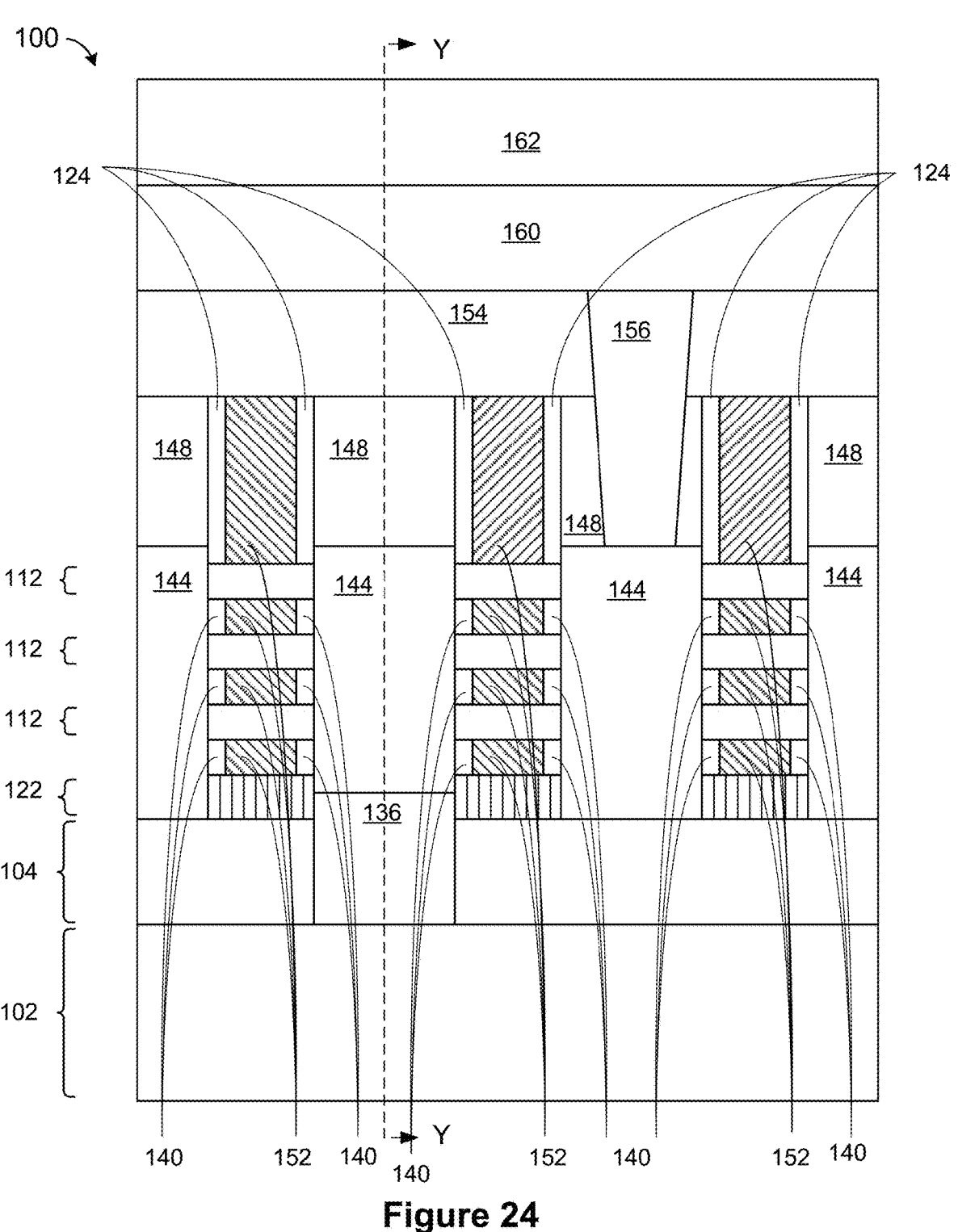
FIGS. 24 and 25 each illustrate a cross-sectional view of the semiconductor structure along section line X-X and Y-Y, respectively, and illustrate formation of back end of line layers and bonding of a carrier wafer to the semiconductor structure, according to an exemplary embodiment.
Figure 25:
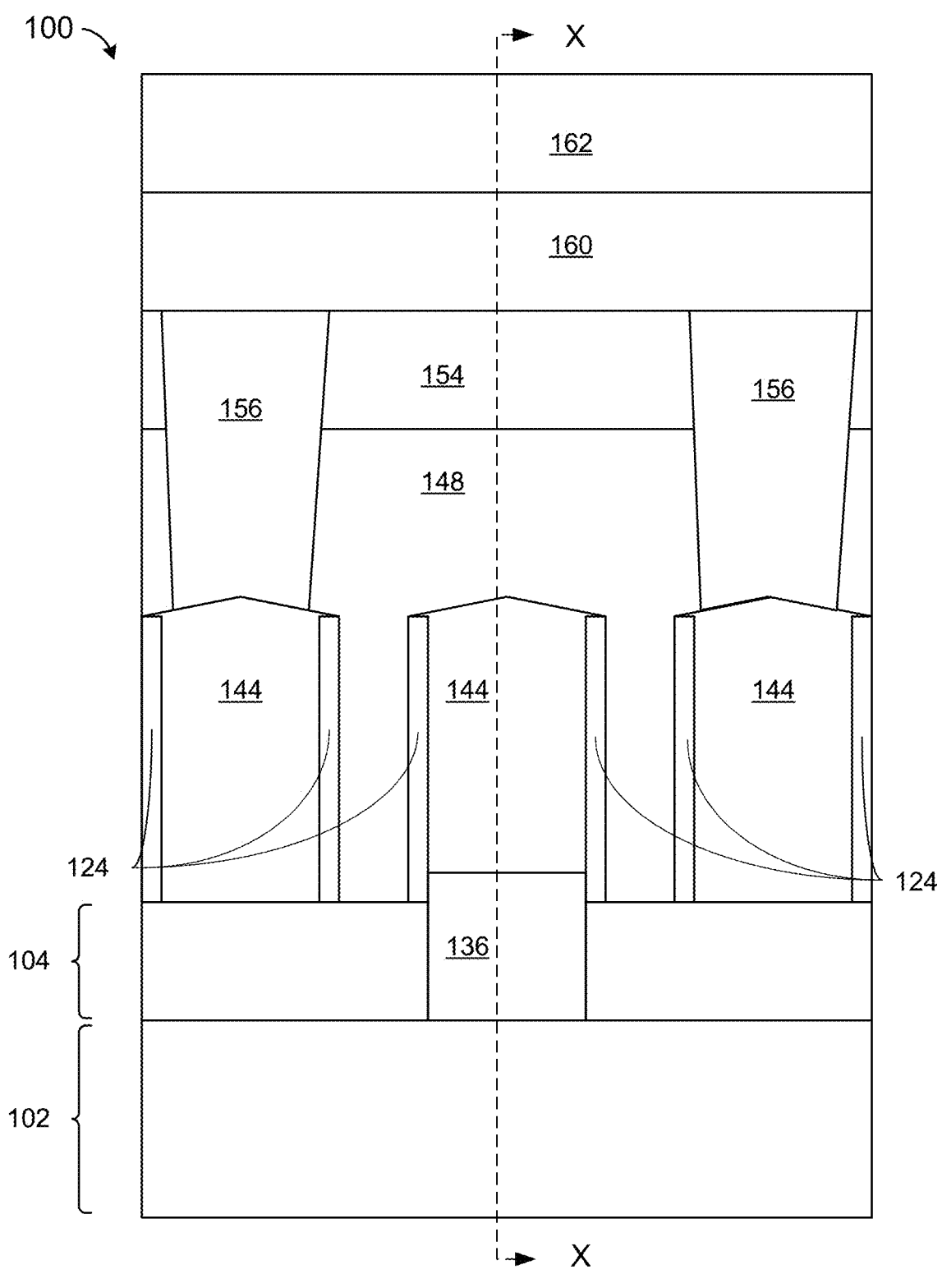

Referring now to FIGS. 24 and 25, the structure 100 is shown according to an exemplary embodiment. FIGS. 24 and 25 are each a cross-sectional view of the structure 100 along section lines X-X and Y-Y, respectively. FIGS. 24 and 25 are perpendicular to each other. Back end of line (hereinafter "BEOL") layers 160 (hereinafter "BEOL") may be formed. A carrier wafer 162 may be bonded to the structure 100.

The BEOL layers 160 may be include layers of wiring and vias formed above the existing structure, above the contact 145 and the ILD 154. In an embodiment, the BEOL layers 160 may include 12 or more layers of metal lines and visas. The BEOL layers 160 may be formed using known techniques.

The carrier wafer 162 may be attached to an upper surface of the structure 100, mounted on an upper surface of the BEOL layers 160.

The carrier wafer may be attached using conventional wafer bonding process, such as dielectric-to-dielectric bonding or copper-to-copper bonding process.

Figure 26:
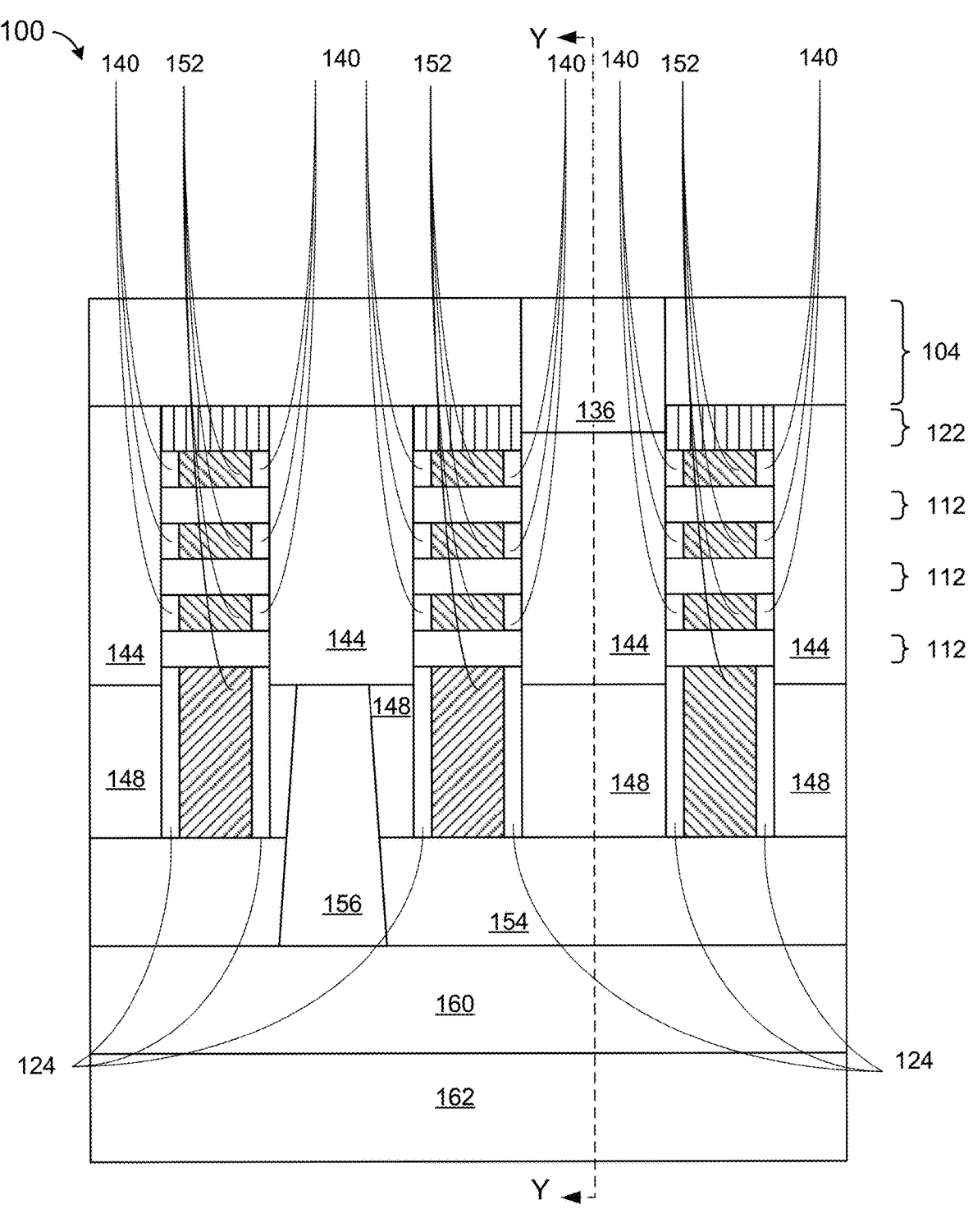
FIGS. 26 and 27 each illustrate a cross-sectional view of the semiconductor structure along section line X-X and Y-Y, respectively, and illustrate flipping the semiconductor structure over and removal of a silicon-on-insulator portion of a substrate of the semiconductor structure, according to an exemplary embodiment.
Figure 27:
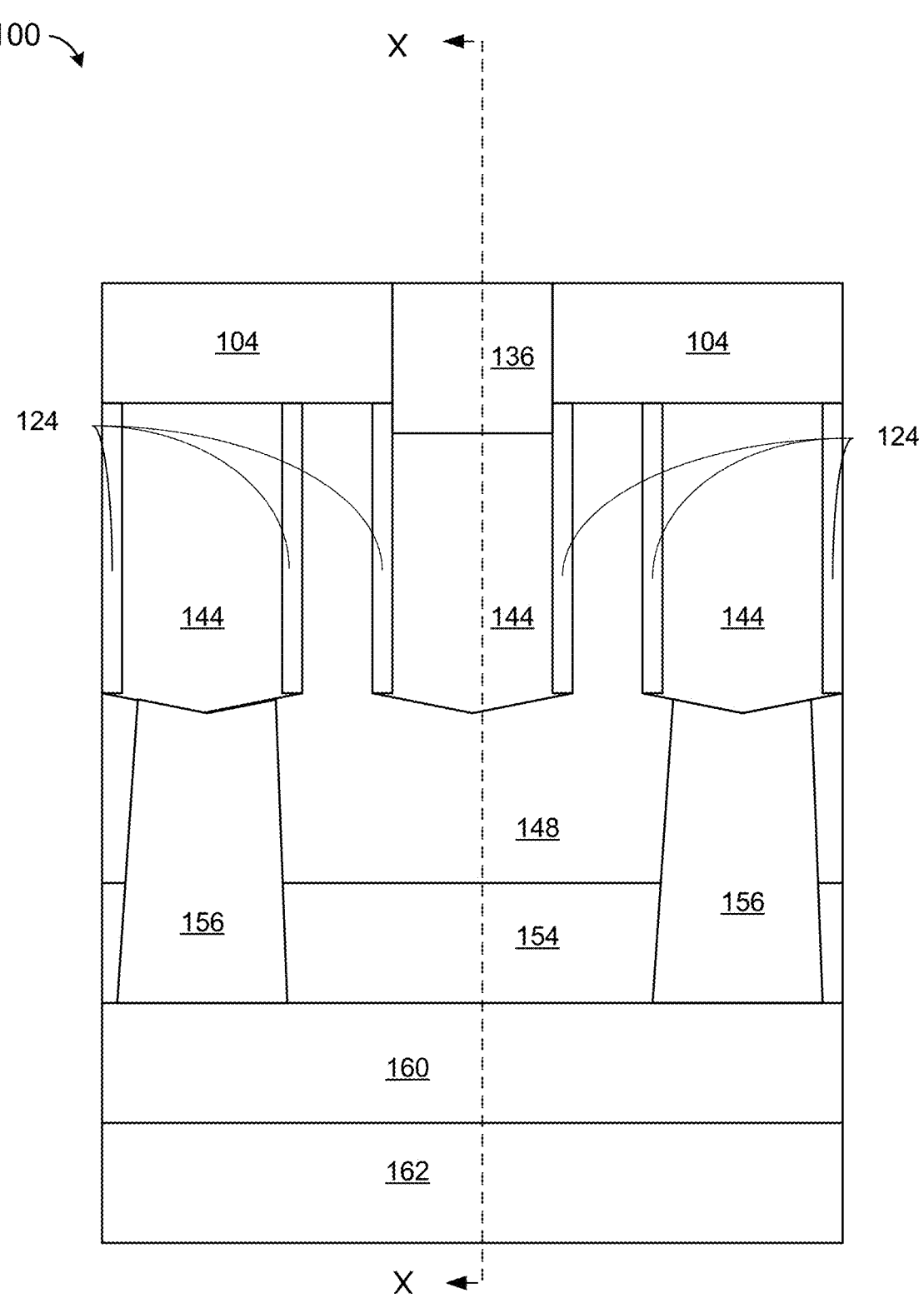

Referring now to FIGS. 26 and 27, the structure 100 is shown according to an exemplary embodiment. FIGS. 26 and 27 are each a cross-sectional view of the structure 100 along section lines X-X and Y-Y, respectively. FIGS. 26 and 27 are perpendicular to each other. The structure 100 may be flipped and the silicon substrate 102 may be removed.

The structure 100 may be turned such that the carrier wafer 162 is now at shown at the bottom of FIGS. 26 and 27, at a lowest point of the structure, and the silicon substrate 102 is at a upper level of the structure for further processing.

The silicon substrate 102 may be selectively removed using a combination of processes steps, such as wafer grinding, CMP, RIE and wet etch process. The final stage of the process may include selectively etching any remaining silicon of the silicon substrate 102 to expose a surface of the BOX SiO2 104 and to expose the sacrificial backside contact placeholder 136.

The silicon substrate 102 may be removed and an upper horizontal surface of the structure 100 includes an upper horizontal surface of the sacrificial backside contact place-holder 136 and an upper horizontal surface of the BOX SiO2 104. There may be more than one sacrificial backside contact placeholders 136. Each of the sacrificial backside contact placeholders 136 may be adjacent to a source drain 144 which does not have a contact 156.

Figure 28:
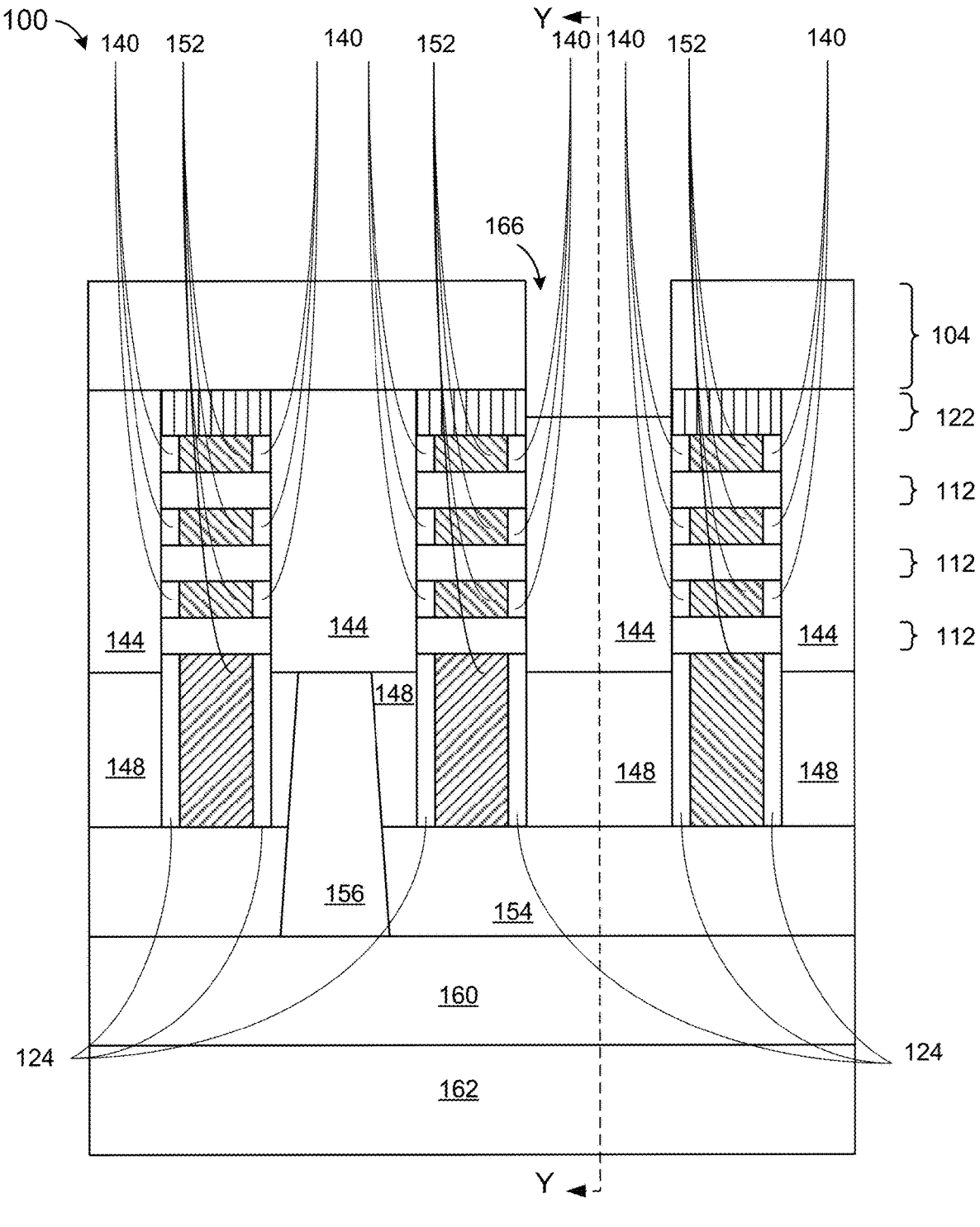
FIGS. 28 and 29 each illustrate a cross-sectional view of the semiconductor structure along section line X-X and Y-Y, respectively, and illustrate removal of the sacrificial backside contact placeholder and formation of a bottom contact opening, according to an exemplary embodiment.
Figure 29:
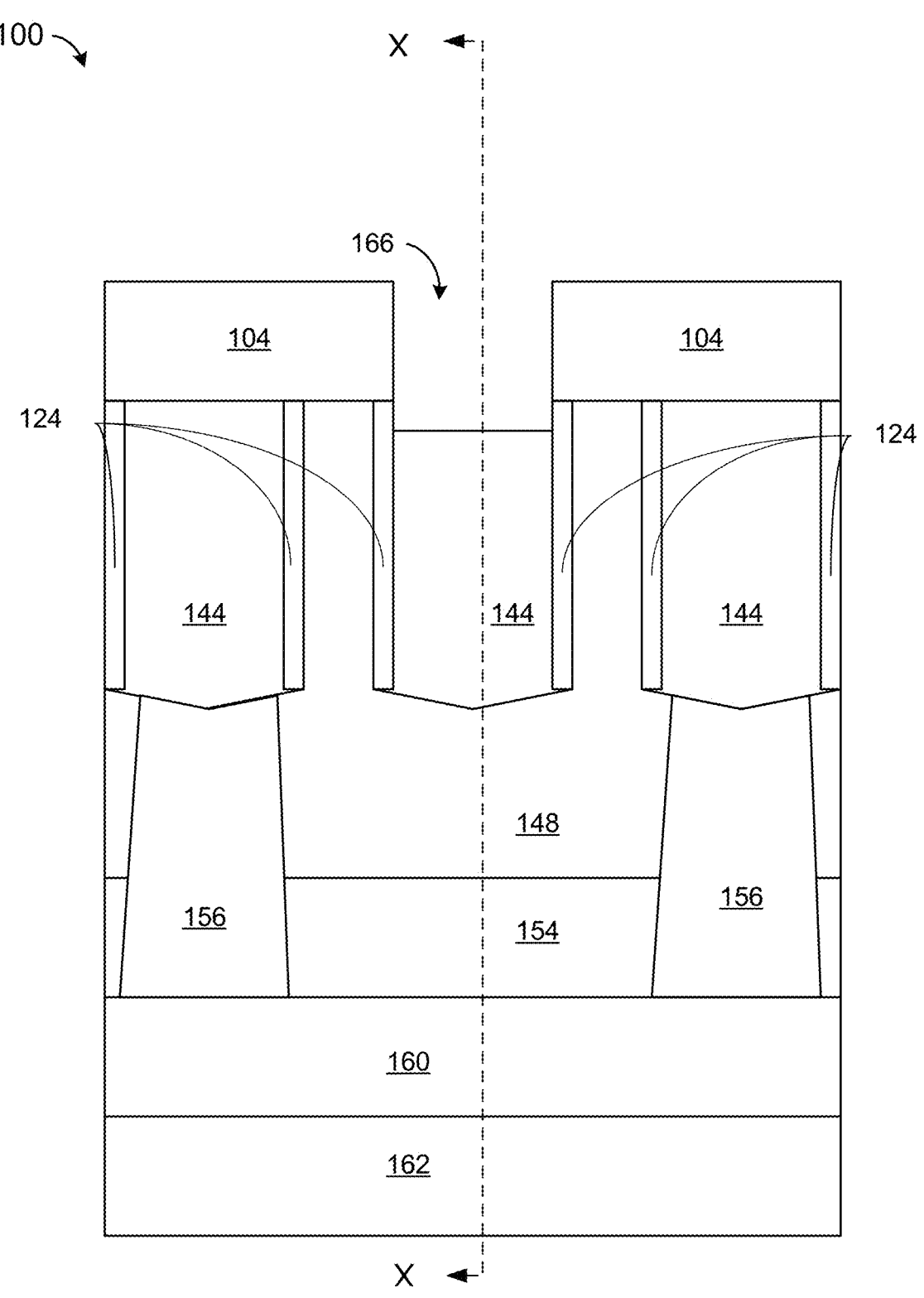

Referring now to FIGS. 28 and 29, the structure 100 is shown according to an exemplary embodiment. FIGS. 28 and 29 are each a cross-sectional view of the structure 100 along section lines X-X and Y-Y, respectively. FIGS. 28 and 29 are perpendicular to each other. The sacrificial backside contact placeholder 136 may be removed and a bottom contact opening 166 formed.

The sacrificial backside contact placeholder 136 may be selectively removed using known techniques, forming the bottom contact opening 166. For example, a wet or dry etch process can be used with the appropriate chemistry to remove the sacrificial backside contact placeholder 136. The material used for the etching process may be selective such that the BDI 122 and the box BOX SiO2 104 remain and are not etched.

Figure 30:
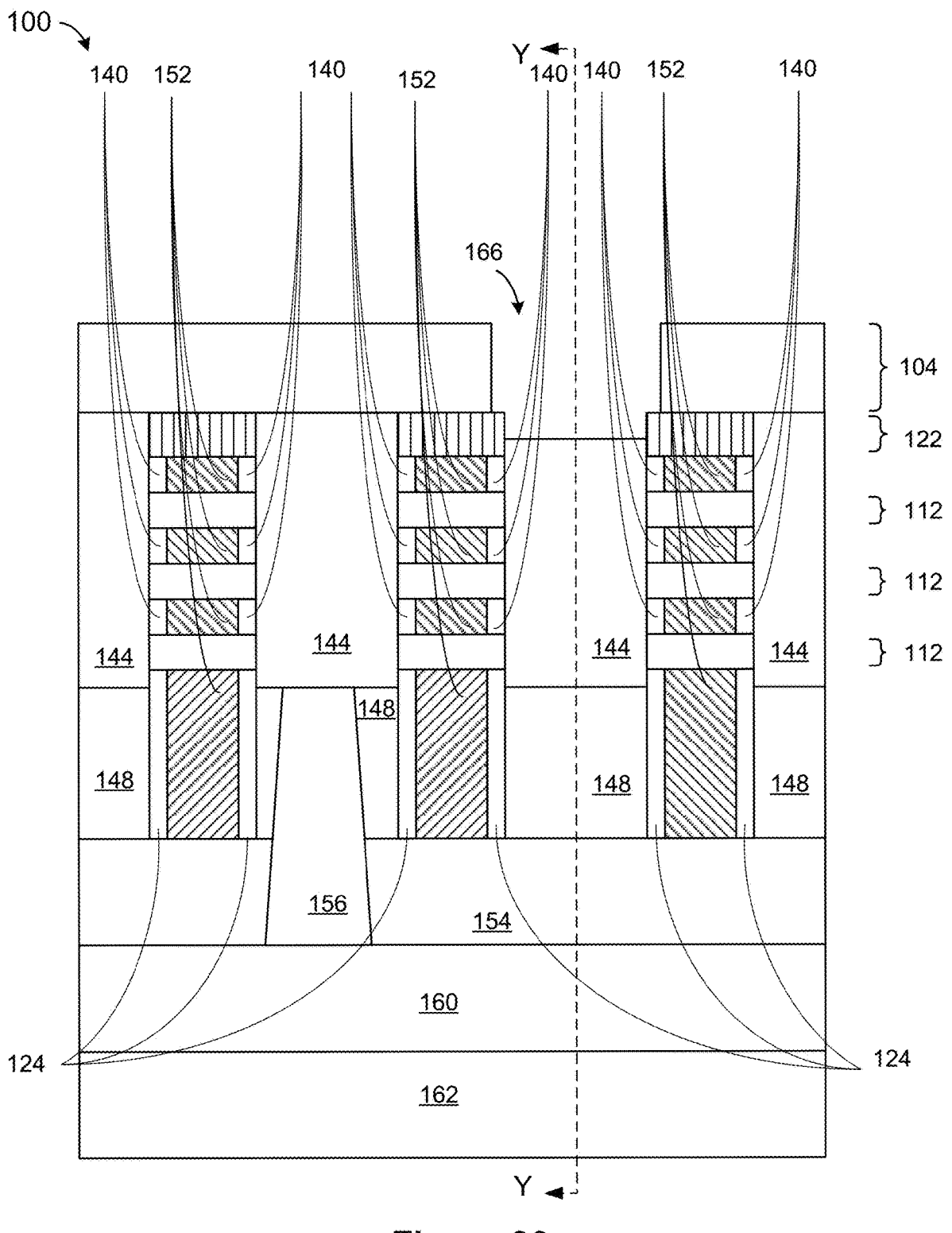
FIGS. 30 and 31 each illustrate a cross-sectional view of the semiconductor structure along section line X-X and Y-Y, respectively, and illustrate a pre-epitaxy clean, according to an exemplary embodiment.
Figure 31:
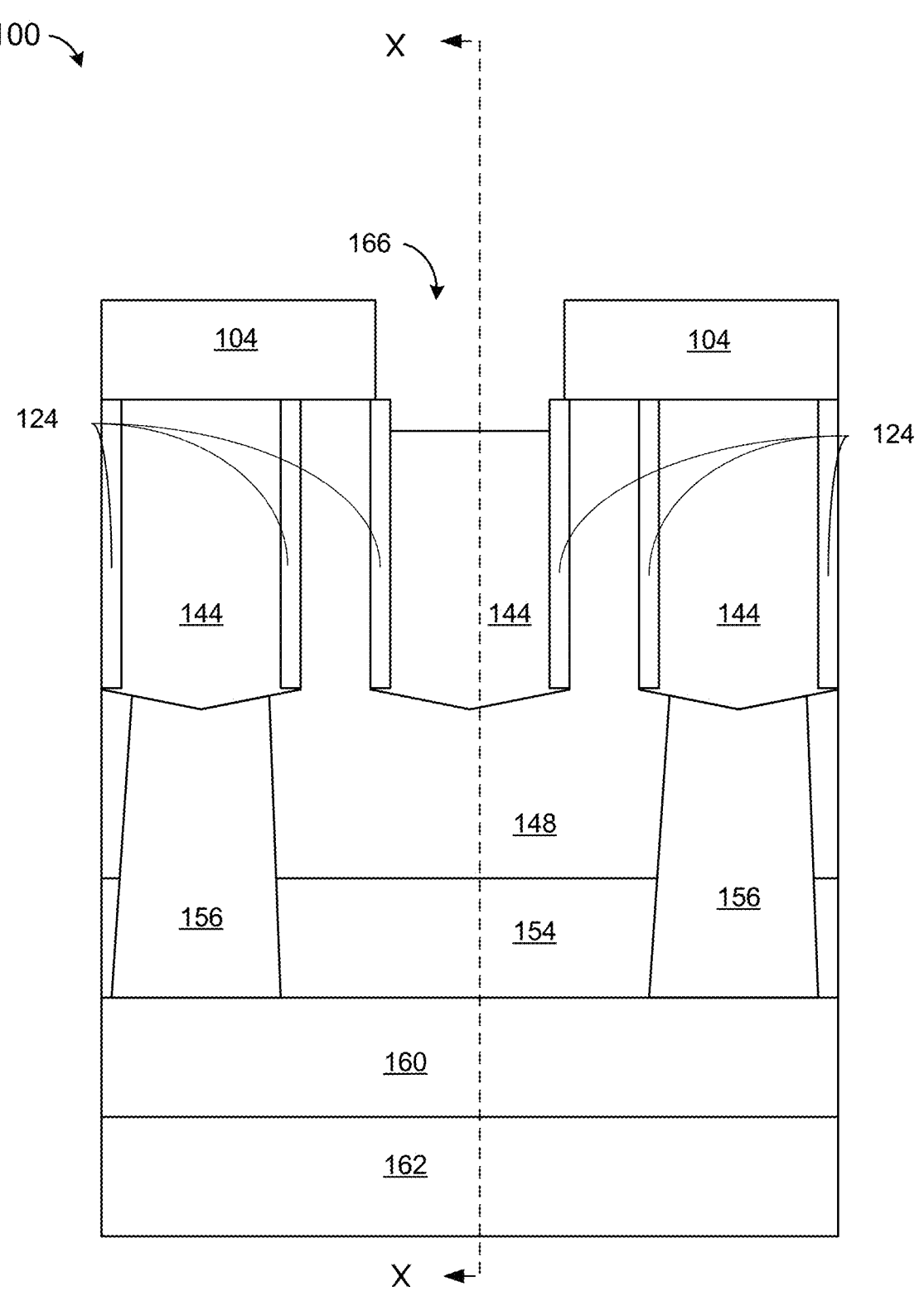

Referring now to FIGS. 30 and 31, the structure 100 is shown according to an exemplary embodiment. FIGS. 30 and 31 are each a cross-sectional view of the structure 100 along section lines X-X and Y-Y, respectively. FIGS. 30 and 31 are perpendicular to each other. A pre-epitaxy clean may be performed.

The pre-epitaxy clean may be done which may remove any native oxide over source drain 144, and during this process, a horizontal portion of the BOX SiO2 104 and a vertical portion of the BOX SiO2 104 may also being etched, increasing a size of the bottom contact opening 166. An example of a pre-epitaxy clean may include a DHF wet clean or SiCoNi dry clean process. Siconi is a trademark of Applied Materials, Inc.

The pre-epitaxy clean may expose a portion of an upper surface of the BDI 122. The pre-epitaxy clean may expose a portion of an upper surface and a portion of a vertical surface of a pair of dielectric spacers 124 surrounding the bottom contact opening 166. While the bottom contact opening 166 is enlarged, the high-k metal gate 152 is isolated from the bottom contact opening 166 due to the BDI 122. The enlarged bottom contact opening 166 is beneficial for forming a larger trench epitaxy growth volume helping to lower contact resistance of a subsequently formed contact in the bottom contact opening 166.

Figure 32:
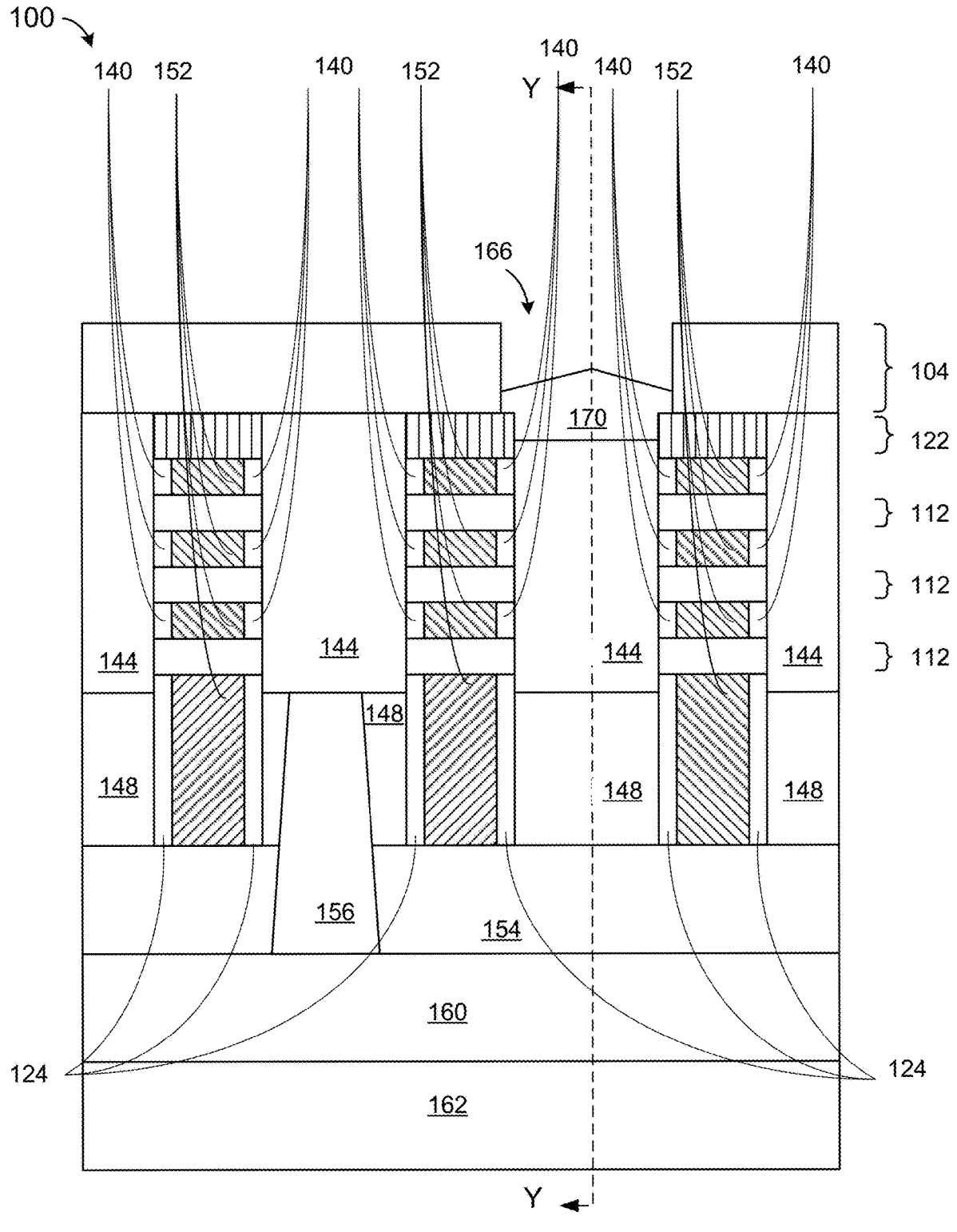
FIGS. 32 and 33 each illustrate a cross-sectional view of the semiconductor structure along section line X-X and Y-Y, respectively, and illustrate forming an epitaxy, according to an exemplary embodiment.
Figure 33:
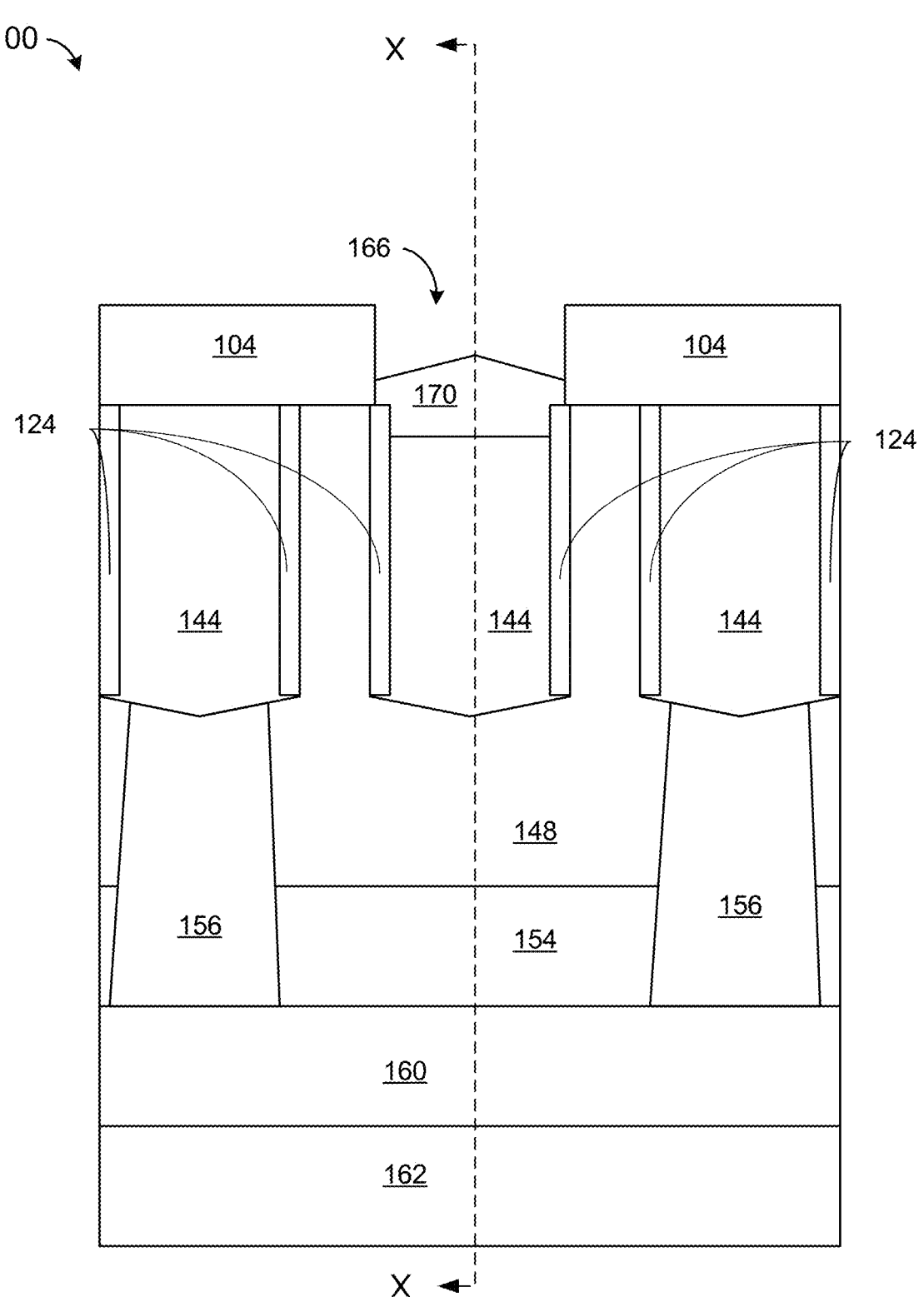

Referring now to FIGS. 32 and 33, the structure 100 is shown according to an exemplary embodiment. FIGS. 32 and 33 are each a cross-sectional view of the structure 100 along section lines X-X and Y-Y, respectively. FIGS. 32 and 33 are perpendicular to each other. An epitaxy region 170 may be formed.

Forming the epitaxy region 170 requires conditions which will not damage the BEOL layers 160 and the high-k metal gates 152, and requires a low thermal-budget process. The low-thermal-budget process may refer to low-temperature epitaxial processes conducted at temperatures below 450° C. for a duration of minutes. The low-thermal-budget process may also refer to short duration thermal process from about 1 millisecond to about 10's of nanoseconds conducted at a high temperature ranging from 750° C. to 1300° C. A trench epitaxy refers to an epitaxial process of forming or re-forming a surface layer of the source drain 144 which is drain doped semiconductor through the bottom contact opening 166. The trench epitaxy may include a combination of gas-phase epitaxial growth, solid-phase epitaxial re-growth, and liquid phase epitaxial re-growth to form the epitaxy region 170 as described below.

During the gas-phase epitaxial growth, the gaseous pre-cursors are supplied to a lower semiconductor surface of the source drain 144 and held at a low temperature of 450° C. or less. The gaseous precursors are selected to enable the epitaxial growth of a target semiconductor-dopant alloy at such low temperature. A silicon precursor may include Disilane (Si2H6). A germanium precursor may include Germane (GeH4) and Digermane (Ge2H6). A carbon pre-cursor may include Methane (CH4). A tin precursor may include Tin Tetrachloride (SnC14). A boron precursor may include Diborane (B2H6). A gallium precursor may include Trimethylgallium (TMG). An aluminum precursor may include Trimethylaluminum (TMA). A phosphorus precur-sor may include Phosphine (PH3). An arsenic precursor may include Arsine (AsH3). These gaseous precursors can be mixed with a neutral carrier gas such as hydrogen H2, helium He, or argon Ar and delivered to the heated substrate to form an epitaxial layer on the lower surface of the source drain 144. During epitaxial growth on the underlying crys-talline source drain semiconductor surface of the source drain 144, the precursor radicals carrying Group IV elements quickly arrange themselves in a regular periodic matrix aligned to the periodicity of underlying crystalline lattice. A precursor radical carrying dopant element swept to the growing surface of the epitaxy region 170 is then forced to occupy a substitutional lattice site in this periodic arrange-ment of surface-attached radicals/elements. Effectively, the dopant element is forced to occupy a substitutional lattice site by its neighbors or, equivalently, the growing epitaxial front despite the fact that the substitutional lattice site may not be energetically favorable for the dopant atom. To put it in other words, such substitutionally-placed dopant atoms are metastable with respect to the semiconductor lattice and may precipitate out forming electrically inactive dopant interstitials and clusters, however, the low temperature of epitaxial growth helps preventing this from happening and effectively locks in the dopants in their metastable substi-tutional sites. As the result, the grown epitaxial layer of the epitaxy region 170 has a large amount of electrically active dopant, or, equivalently a large amount of free electrical carriers such as holes and electrons. Optimization of trench epitaxial process by selecting a set of precursors and varying precursor and carrier gas flow ratios, and process pressure and temperature is directed toward maximizing resultant concentration of free electrons for contacts to n-type semi-conductor (n-FET S/D) or free holes for contacts to p-type semiconductor (p-FET S/D). Concentration of free carriers (electrons or holes) in these epitaxial layers of higher than $7e20$ $cm^{-3}$ and, in some embodiments, higher than $1e21$ $cm^{-3}$ is achievable. In contrast, a more typical thermal dopant activation via high-temperature (above 1000° C.)

annealing of doped semiconductors results in concentration of free carriers of from about 2e20 $cm^{-3}$ to about 5e20 $cm^{-3}$ and is not compatible with the temperature sensitive structures present in the substrate. At the low deposition temperature and optimized for maximum free carrier concentration, the epitaxial growth process can be slow and non-selective. In a non-selective process, deposition of semiconductor may occur over the entire substrate surface. In contrast, in a selective deposition process the semiconductor material deposits epitaxially on semiconductor surfaces and generally does not deposit on other exposed surfaces such as dielectric surfaces. However, in one embodiment, a low-temperature epitaxial layer can be made thin in a range of 1-3 nanometers thick or only 2-6 monolayers of epitaxial semiconductor. In this ultra-thin regime, a different speed of nucleating semiconductor material on the surfaces of crystalline semiconducting material and dielectric material may result in different thickness of resultant semiconductor layer formed over these dissimilar surfaces. The resultant semiconductor layer is typically thinner over dielectric surfaces and can be discontinuous or be absent over portions of these surfaces. The thinner, discontinuous semiconductor layer can be removed in an in-situ etching step conducted within the epitaxial growth equipment. This deposition, etch sequence can be repeated multiple times yielding final epitaxial semiconductor layer thickness of from 1 nm to about 10 nm on exposed crystalline surfaces only. The etch step is typically conducted via adding or pulsing HCl (hydrochloric acid) vapors into the growth chamber. In some embodiments, the HCl vapors can be added continuously during the epitaxial growth process to allow for a continuous removal of semiconductor film nucleated on dielectric surfaces. This approach is possible if HCl vapors do not interfere with incorporating electrically active dopants into the epitaxial film.

Exact chemical composition of the trench epitaxial film may vary and several dissimilar chemical compositions may yield the maximum amount of free carriers in the film and a low contact resistivity of the metal-semiconductor interface. Yet, some chemical configurations for these films are more preferred than others leading to even lower contact resistivity of the metal-semiconductor interface. In one embodiment, p-type trench epitaxial layer is grown over p-type semiconductor source drain 144. The p-type trench epitaxial layer is preferably SiGe with the Ge content from about 50 atomic percent (at. %) to about 95 at. %. Increasing amount of high atomic number (high-Z) germanium in the epi layer leads to a higher pinning of the semiconductor valence band to the adjacent metal Fermi level, thereby, reducing Schottky barrier and contact resistivity of the interface. In some embodiments, even larger (higher-Z) tin (Sn) can be added to SiGe in small amounts (up to about 5 at. %) to further promote this pinning. An additive benefit of using a higher amount of Ge in the trench epi layer is a lower epi growth temperature. Boron can be used as p-type dopant to yield concentration of free holes in the excess of 7e20 $cm^{-3}$ for SiGe trench epi films with Ge amount of less than 66 at. %. However, Boron becomes a less efficient p-type dopant for semiconductors with larger lattice spacing such as SiGe with Ge amount in excess of 60 at. %. Gallium or Aluminum can be added to SiGeB or SiGeSnB films to maximize the free hole concentration, especially, for semiconductors with a larger lattice spacing. The total chemical concentration of p-type dopant in a trench epitaxy surface layer of the epitaxy region 170 is preferably equal to or exceeds 5 at. %, or, equivalently, 2.5e21 $cm^{-3}$.

In another embodiment, n-type trench epitaxial layer is grown over n-type semiconductor source drain 144. The n-type trench epitaxial layer is preferably Si. In some embodiments, a small amount of Carbon (up to about 1 at. %) can be added to Si to compress its lattice spacing. Phosphorus can be used as an efficient n-type dopant to yield concentration of free electrons in the excess of 7e20 $cm^{-3}$. The total chemical concentration of n-type dopant in the trench epitaxy surface layer of the epitaxy region 170 is preferably equal to or exceeds 5 at. %, or, equivalently, 2.5e21 $cm^{-3}$.

In some embodiments, the epitaxy region 170 may include a solid-phase epitaxial re-growth or a liquid phase epitaxial re-growth, as alluded above. In these approaches, a thin surface semiconductor layer with dopants is first transformed to an amorphous or liquid state and then epitaxially re-grown activating dopants. The physical process of activating dopants is similar to that of low-temperature gas-phase epitaxy but the trapping efficiency of dopants into substitutional lattice sites can be higher due to faster growing epitaxial front. Compatibility to the temperature-sensitive BEOL structures and high-k metal gate 152 is achieved through the extreme shortness of the epitaxial re-growth process rather than through a low process temperature. In the liquid phase epitaxial re-growth, the semiconductor surface layer of the lower surface of the source drain 144 is converted into a liquid state through a nanosecond-scale laser annealing that raises surface temperature above the melting point for 10's to 100's of nanoseconds. The surface semiconductor layer of the lower surface of the source drain 144 may have a different melting point than the rest of source drain 144 such as the case of SiGe with a high at. % Ge. For instance, SiGe with 70 at. % Ge has the melting point of 1160° C., whereas SiGe with 50 at. % Ge has the melting point of 1270° C. After laser exposure, the surface cools with the speed of about billion degrees per second resulting in an epitaxial re-growth of the liquid layer with the epitaxial front speed of about meter per second. In the solid phase epitaxial re-growth, the semiconductor surface layer is first converted into an amorphous layer through an implantation process. Implantation may employ ions of electrically neutral elements such as Si, Ge, Ar, Xe or dopants such as Ga (for p-type semiconductor) and P (for n-type semiconductor). The ion implantation energy can be adjusted to yield a desired amorphous layer thickness in the range of 1 nm to 10 nm. The implantation process can be conducted at sub room temperature (e.g. at −100° C.) to enhance amorphization efficiency. The semiconductor amorphous layer is then epitaxially re-grown through a microsecond-scale annealing that raises surface temperature above 750° C. for 10's to 100's of microseconds. Low annealing temperature requires longer annealing duration for full epitaxial re-growth but the annealing process remains compatible with the temperature-sensitive structures. The surface heats and cools with the speed of millions degrees per second resulting in an epitaxial re-growth of the amorphous layer with the epitaxial front speed of about millimeter per second. While substantially slower than the epitaxial front speed of the liquid phase epitaxial re-growth, it is still much faster than the speed of low-temperature gas phase epitaxy at about angstroms per second. It is this fast epitaxial growth and fast temperature quench that may yield concentration of free electrons or holes in the trench epitaxial layer in the excess of 1e21 $cm^{-3}$.

The epitaxy region 170 may be formed in the bottom contact opening 166. The epitaxy region 170 may be grown from the source drain 144. As viewed in the flipped over state, a lower horizontal surface of the epitaxy 170 may be an upper horizontal surface of the source drain 144. An additional lower horizontal surface of the epitaxy region 170 may be a portion of an upper horizontal surface of the BDI 122. A portion of a vertical side surface of the epitaxy region 170 may be a portion of a vertical side surface of the BOX SiO2 104. An additional vertical side surface of the epitaxy region 170 may be a portion of a vertical side surface of the dielectric spacer 124. An additional vertical side surface of the epitaxy region 170 may be a portion of a vertical side surface of the BDI 122. The epitaxy region 170 may partially fill the bottom contact opening 166. The epitaxy region 170 is made compatible to the respective source drain 144, that is, if source drain 144 is n-type (n-FET), then the epitaxy region 170 is also n-type for n-FET contact, if source drain 144 is p-type (p-FET), then the epitaxy region 170 is also p-type for p-FET contact.

Figure 34:
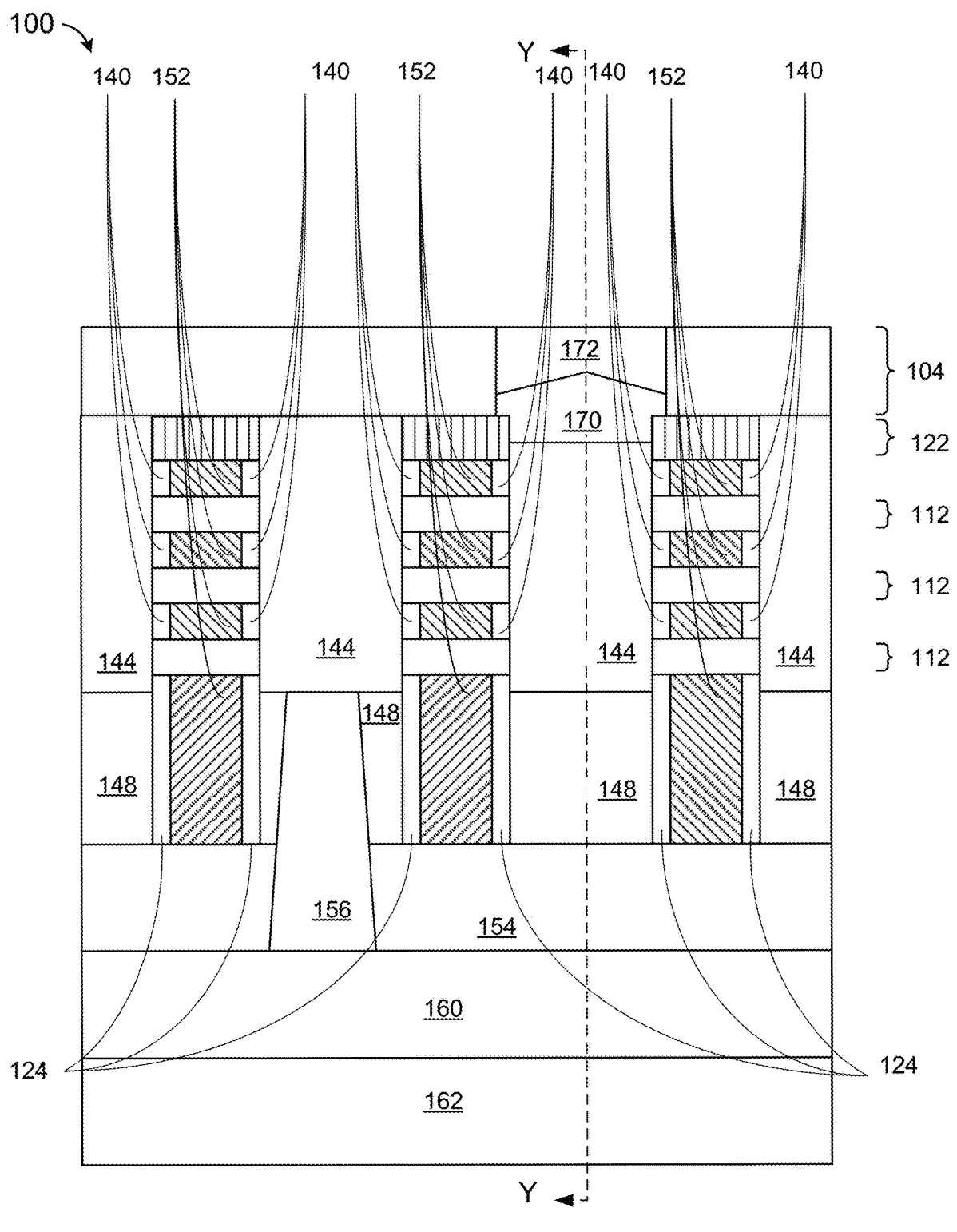
FIGS. 34 and 35 each illustrate a cross-sectional view of the semiconductor structure along section line X-X and Y-Y, respectively, and illustrate forming a bottom contact, according to an exemplary embodiment.
Figure 35:
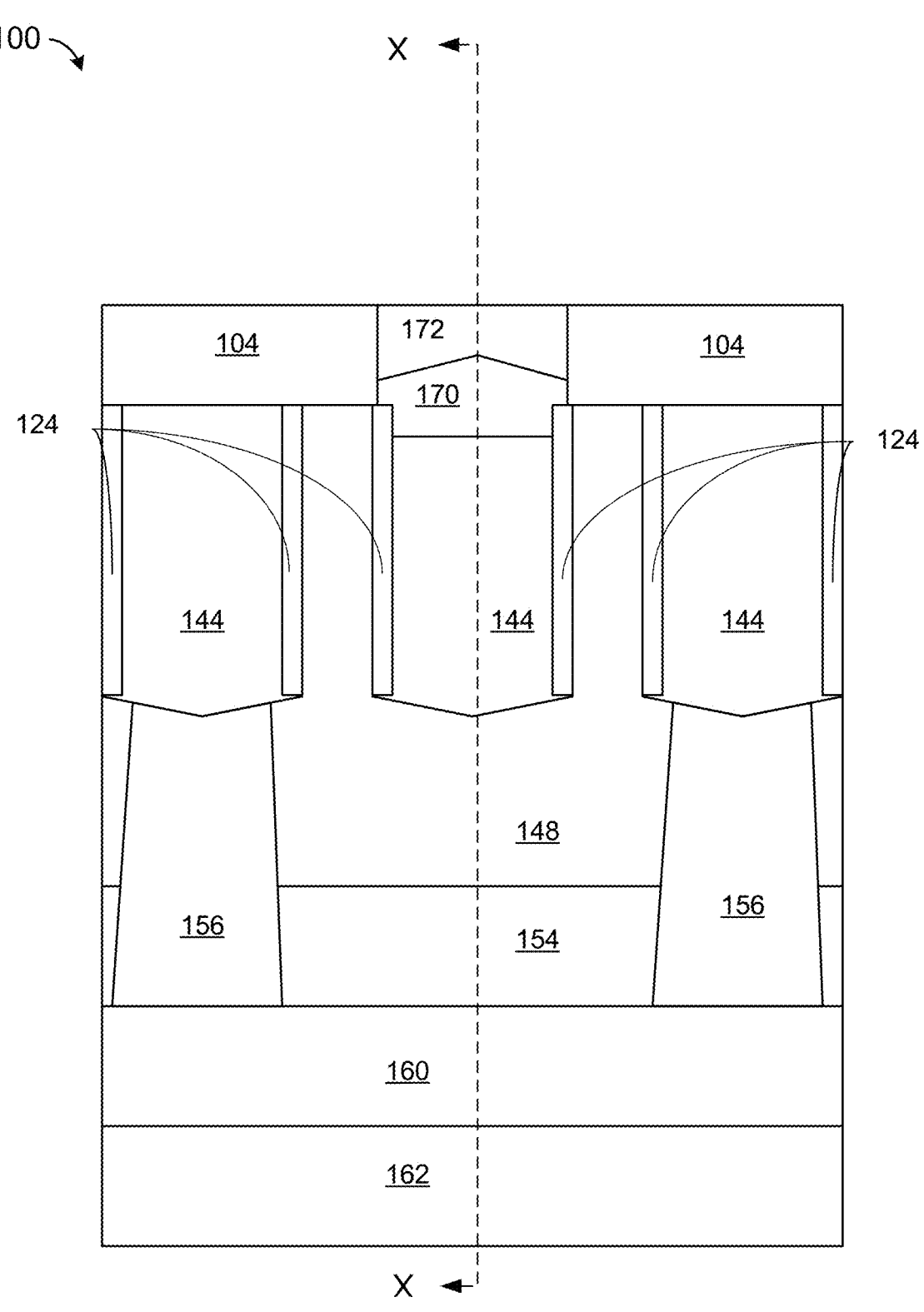

Referring now to FIGS. 34 and 35, the structure 100 is shown according to an exemplary embodiment. FIGS. 34 and 35 are each a cross-sectional view of the structure 100 along section lines X-X and Y-Y, respectively. FIGS. 34 and 35 are perpendicular to each other. A bottom contact 172 may be formed.

The bottom contact 172 may be formed in the bottom contact opening 166 to form a contact to the source drain 144 through the epitaxy region 170. As shown in FIGS. 34 and 35, there is one bottom contact 172. There may be any number of bottom contacts 172 on the structure 100.

Forming the bottom contact 172 involves filling the bottom contact opening 166 with highly-conductive metallic materials. Individual metallic materials within the bottom contact 172 are not shown for clarity. While the bulk of the bottom contact 172 includes an elemental metal such as Co, Ru, or Mo to reduce its bulk resistivity, the metallic compound directly adjacent to the semiconductor of the epitaxy region 170 is selected to reduce the contact resistance between the bottom contact 172 and the semiconductor of the epitaxy region 170. In one embodiment, the metallic compound adjacent to the semiconductor of the epitaxy region 170 is a metal silicide or germanosilicide. This compound can be created by reacting an elemental metal such as Titanium with the semiconductor of the epitaxy region 170. While metal silicide/germanosilicide is made thin, typically less than 3 nm, it sets the Schottky barrier of the semiconductor-metal interface and, ultimately, the contact resistivity of the interface. The metal silicide/germanosilicide may be separated from the elemental metal fill of the bottom contact 172 by a thin conductive metallic liner such as Titanium Nitride liner. High concentration of free carriers in the semiconductor of the epitaxy region 170 and a low Schottky barrier between the metal silicide/germanosilicide and the semiconductor of the epitaxy region 170 allows for a low contact resistivity of about $10^{-9}$ $\Omega \cdot cm^2$ for the backside contact structure to both n-type and p-type semiconductors. Presence of multiple metallic compounds within the bottom contact 172 does not affect much its series resistance because additional interfacial compounds and liners are made thin in comparison to the elemental metal fill and each metal-metal interfacial resistance is at least an order of magnitude lower than that of semiconductor-metal interface.

A contact resistivity of the epitaxy region 170 to the adjacent metallic compound of the bottom contact 172 may be equal to or less then 1e-9 Ohm $cm^2$. A volume concentration of free electrical carriers (electrons or holes) of the epitaxy region 170 may be equal to or more than 7e20 $cm^{-3}$.

In comparison, a contact resistively of the source drain 144 to the contact 156 may be greater than or equal to 2e-9

Ohm $cm^2$. A volume concentration of free electrical carriers (electrons or holes) of the source drain 144 may be less than or equal to 5e20 $cm^{-3}$.

The bottom contact 172 may be made to the source drain 144 which does not have a contact 156. The source drain 144 may have either a contact 156 or a bottom contact 172. This provides more options for a source drain contact. In an example, a source drain 144 of an n-FET nanosheet stack may each have a contact 156 and a source drain 144 of a p-FET nanosheet stack may each have a bottom contact 172. The alternative is also an embodiment.

A chemical mechanical polishing (CMP) technique may be used to remove excess material and polish upper surfaces of the structure 100. An upper surface of the structure 100 may include an upper horizontal surface of the BOX SiO2 104 and an upper horizontal surface of the bottom contact 172.

Figure 36:
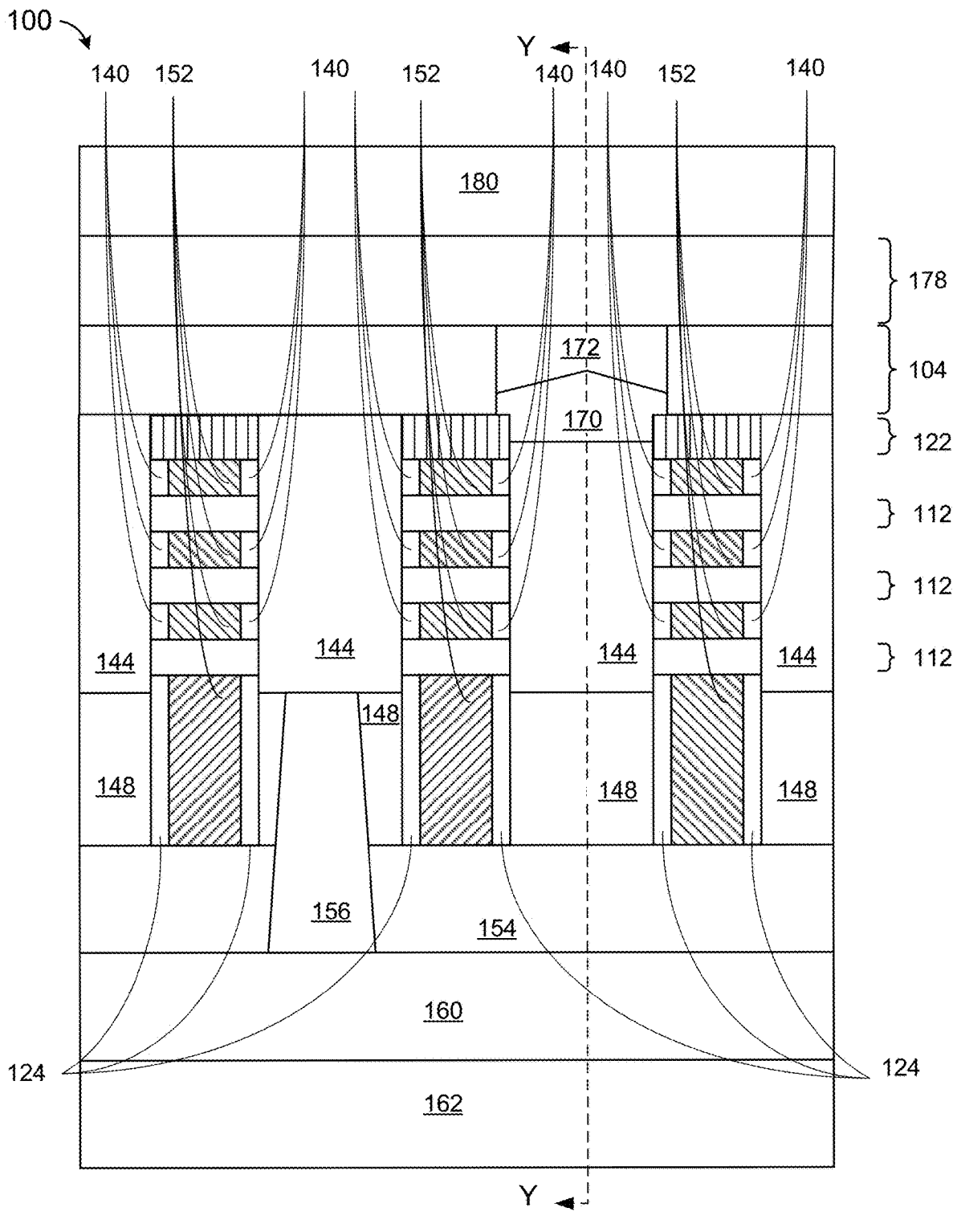
FIGS. 36 and 37 each illustrate a cross-sectional view of the semiconductor structure along section line X-X and Y-Y, respectively, and illustrate forming an inter-layer dielectric, a backside power rail and a backside power delivery network, according to an exemplary embodiment.
Figure 37:
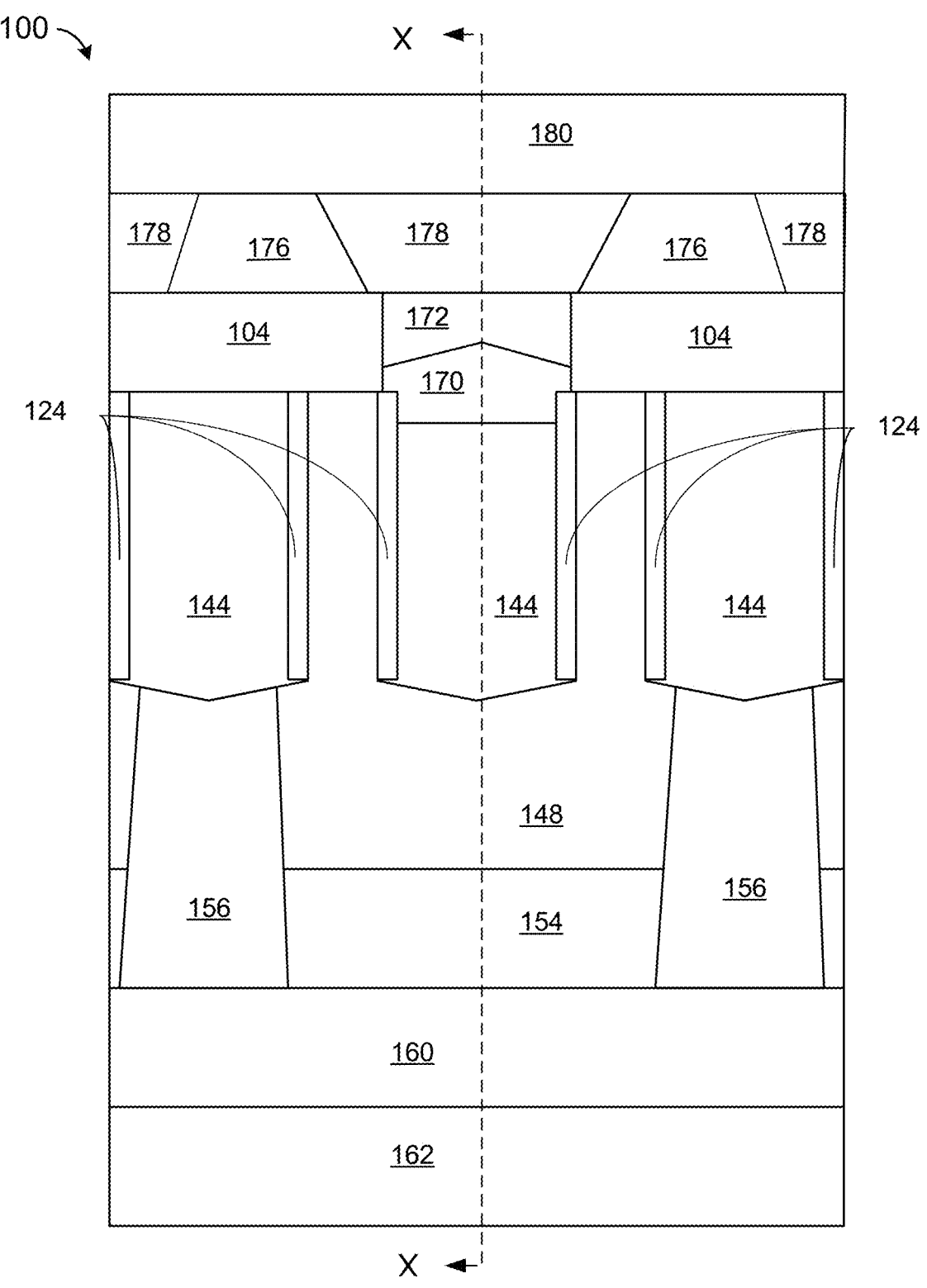

Referring now to FIGS. 36 and 37, the structure 100 is shown according to an exemplary embodiment. FIGS. 36 and 37 are each a cross-sectional view of the structure 100 along section lines X-X and Y-Y, respectively. FIGS. 36 and 37 are perpendicular to each other. An inter-layer dielectric (hereinafter "ILD") 176 may be formed. A backside power rail (hereinafter "BPR") 178 and a backside power delivery network (hereinafter "BSPDN") 180 may be formed.

The ILD 176 may be formed by conformally depositing or growing a dielectric material, as described for the ILD 148. A lower surface of the ILD 148 may be adjacent to the upper horizontal surface of the BOX SiO2 104 and the upper horizontal surface of the bottom contact 172. A chemical mechanical polishing (CMP) technique may be used to remove excess material and polish upper surfaces of the structure 100.

The BPR 178 may be formed in openings (not shown) in the ILD 176 using known techniques. In an embodiment, the BPR 178 may be parallel to section line X-X and perpendicular to section line Y-Y. A lower horizontal surface of the BPR 178 may be adjacent to an upper horizontal surface of the bottom contact 172. As shown in FIG. 37, there are three BPRs 178, however there may be any number of BPRs 178 in the structure 100.

The BSPDN 180 may be formed on the ILD 176 and on the BPR 178. The BSPDN 180 may include additional layers of wiring and vias formed above the existing structure, above the ILD 176 and on the BPR 178. In an embodiment, the BSPDN 180 may include 12 or more layers of lines and visas. The BSPDN 180 may be formed using known techniques.

The resulting structure 100 includes an FET nanosheet with a self-aligned backside trench epitaxy providing a contact with low contact resistively, providing additional options for forming a contact to the FET nanosheet on the backside of the structure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
a first source drain region adjacent to a first transistor on a substrate;
a second source drain region adjacent to a second transistor on the substrate;
an upper source drain contact vertically aligned above and electrically connected to the first source drain region;
a bottom source drain contact vertically aligned below and electrically connected to the second source drain region, wherein the bottom source drain contact and the upper source drain contact are on opposite sides of the semiconductor device, wherein a width of the bottom source drain contact is greater than a width of the second source drain region;
an epitaxial region between the bottom source drain contact and the second source drain region; and
a bottom dielectric isolation region below and vertically aligned with a gate associated with the first transistor, wherein a sidewall of the bottom dielectric isolation region directly contacts a sidewall of the epitaxial region.

2. The semiconductor device according to claim 1, wherein the epitaxial region comprises a volume concentration of free electrical carriers equal to or more than 7e20 cm$^{-3}$, and wherein the first source drain region and the second source drain region each comprise a volume concentration of free electrical carriers equal or less than 5e20 cm$^{-3}$.

3. The semiconductor device according to claim 1, further comprising:
a backside power rail below and directly contacting the bottom source drain contact.

4. The semiconductor device according to claim 3, further comprising:
a backside power delivery network below the backside power rail.

5. A semiconductor device comprising:
a substrate comprising a first nanosheet stack and a second nanosheet stack;
a first source drain adjacent to the first nanosheet stack;
a carrier wafer bonded to an upper surface of the semiconductor device above the first nanosheet stack and the second nanosheet stack;
a bottom source drain contact located on a bottom surface of the first source drain, the bottom source drain contact and the first source drain are vertically aligned, wherein a width of the bottom source drain contact is greater than a width of the first source drain;
an epitaxial region between the bottom source drain contact and the first source drain;
a second source drain adjacent to the second nanosheet stack;
a top source drain contact located on an upper surface of the second source drain, wherein the bottom source drain contact and the top source drain contact are on opposite sides of the semiconductor device; and
a bottom dielectric isolation region below and vertically aligned with a gate associated with the first nanosheet stack, wherein a sidewall of the bottom dielectric isolation region directly contacts a sidewall of the epitaxial region.

6. The semiconductor device according to claim 5, wherein the bottom source drain contact comprises a vertical side surface adjacent to a vertical side surface of a bottom dielectric isolation region below the second nanosheet stack.

7. The semiconductor device according to claim 5, wherein the bottom source drain contact comprises a vertical side surface adjacent to a vertical side surface of a liner of the first source drain, wherein the liner of the first source drain is between the first source drain and a metal gate of the first nanosheet stack.

8. The semiconductor device according to claim 5, wherein the epitaxial region comprises a volume concentration of free electrical carriers equal to or more than 7e20 cm$^{-3}$, and wherein the first source drain and the second source drain each comprise a volume concentration of free electrical carriers free electrical carriers equal or less than 5e20 cm$^{-3}$ $^3$.

9. The semiconductor device according to claim 1, a first width of the epitaxial region is substantially equal to the width of the bottom source drain contact.

10. The semiconductor device according to claim 1, wherein the epitaxial region comprises a first width and a second width both measured in the same direction, wherein the first width of the epitaxial region is substantially equal to the width of the bottom source drain contact.

11. The semiconductor device according to claim 1, wherein the epitaxial region comprises a first width and a second width both measured in the same direction, wherein the second width of the epitaxial region is substantially equal to the width of the second source drain region.

12. A semiconductor device comprising:
a first source drain separated from a gate by a first series of inner spacers;
a second source drain separated from the gate by a second series of inner spacers;
a bottom dielectric isolation region immediately below and directly contacting the gate, wherein a sidewall of the bottom dielectric isolation region is substantially flush with a sidewall of the first series of inner spacers;
an epitaxial region immediately below and directly contacting the first source drain; and
a first contact immediately below and directly contacting the epitaxial region, wherein a width of the first contact is greater than a width of the first source drain.

13. The semiconductor device according to claim 12, further comprising:
a second contact vertically aligned above and directly contacting the first source drain, wherein the first contact and the second contact are on opposite sides of the semiconductor device.

14. The semiconductor device according to claim 12, wherein a sidewall of the bottom dielectric isolation region directly contacts a sidewall of the epitaxial region.

15. The semiconductor device according to claim 12, wherein a bottom surface of the bottom dielectric isolation region directly contacts a top surface of the epitaxial region.

16. The semiconductor device according to claim 12, a first width of the epitaxial region is substantially equal to the width of the first contact.

17. The semiconductor device according to claim 12, wherein the epitaxial region comprises a first width and a second width both measured in the same direction, wherein the first width of the epitaxial region is substantially equal to the width of the first contact.

18. The semiconductor device according to claim 12, wherein the epitaxial region comprises a first width and a second width both measured in the same direction, wherein the second width of the epitaxial region is substantially equal to the width of the first source drain.

19. The semiconductor device according to claim 1, wherein a bottom surface of the bottom dielectric isolation region directly contacts a top surface of the epitaxial region.

20. The semiconductor device according to claim 5, wherein a bottom surface of the bottom dielectric isolation region directly contacts a top surface of the epitaxial region.

\* \* \* \* \*